US012764921B2

(12) United States Patent
Zhu

(10) Patent No.: US 12,764,921 B2
(45) Date of Patent: Oct. 13, 2026

(54) MEMORY DEVICE, METHOD OF MANUFACTURING MEMORY DEVICE, AND ELECTRONIC APPARATUS INCLUDING MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 634 days.

(21) Appl. No.: 18/318,794

(22) Filed: May 17, 2023

(65) Prior Publication Data

US 2023/0380133 A1 Nov. 23, 2023

(30) Foreign Application Priority Data

May 19, 2022 (CN) ......................... 202210561315.8

(51) Int. Cl.
*H10B 12/00* (2023.01)
*H10W 29/00* (2026.01)

(52) U.S. Cl.
CPC ............. *H10B 12/00* (2023.02); *H10B 12/20* (2023.02); *H10W 29/00* (2026.01); *H10W 29/01* (2026.01)

(58) Field of Classification Search
CPC ...... H10B 12/20; H10B 12/48; H10B 12/482; H10B 12/485; H10B 12/488
See application file for complete search history.

(56) References Cited

U.S. PATENT DOCUMENTS

2006/0028858 A1* 2/2006 Atwood .................. G11C 7/22 257/E21.657
2011/0133148 A1 6/2011 Choi
(Continued)

FOREIGN PATENT DOCUMENTS

CN 105518892 A 4/2016
CN 106206600 A 12/2016
(Continued)

OTHER PUBLICATIONS

Translation of Chinese Office Action for corresponding Chinese Patent Application No. 202210561315.8, dated Nov. 29, 2025, 9 pages.

*Primary Examiner* — William Henry Anderson
(74) *Attorney, Agent, or Firm* — Westman, Champlin & Koehler, P.A.

(57) ABSTRACT

Disclosed are a memory device, a method of manufacturing the same, and an electronic apparatus. The memory device includes: first to fourth connection line layers sequentially disposed in a vertical direction relative to a substrate. The first connection line layer includes a plurality of first conductive lines extending parallel in a first direction. One of the second and third connection line layers includes a plurality of conductive lines extending parallel in a second direction intersecting the first direction. The fourth connection line layer includes a plurality of fourth conductive lines extending parallel in a third direction. A memory cell is provided at an intersection of conductive lines. Each memory cell includes first to third transistors stacked in the vertical direction. A fifth connection line layer is provided above the memory cell, and includes a plurality of fifth conductive lines extending in a fourth direction intersecting the third direction.

24 Claims, 16 Drawing Sheets

(56) References Cited

U.S. PATENT DOCUMENTS

| | | | | |
|---|---|---|---|---|
| 2018/0061836 | A1* | 3/2018 | Mathew ............... | H10B 12/395 |
| 2020/0066326 | A1* | 2/2020 | Rios ...................... | G11C 11/409 |
| 2020/0105883 | A1* | 4/2020 | Yamazaki .............. | H10B 12/00 |
| 2020/0365658 | A1 | 11/2020 | Takahashi et al. | |
| 2021/0166751 | A1* | 6/2021 | Teman .................. | G11C 11/405 |

FOREIGN PATENT DOCUMENTS

| | | | |
|---|---|---|---|
| CN | 106340521 | A | 1/2017 |
| CN | 111668219 | A | 9/2020 |

* cited by examiner

MEMORY DEVICE, METHOD OF MANUFACTURING MEMORY DEVICE, AND ELECTRONIC APPARATUS INCLUDING MEMORY DEVICE

CROSS REFERENCE TO RELATED APPLICATION

This application claims priority to Chinese Patent Application No. 202210561315.8, filed on May 19, 2022, the entire content of which is incorporated herein in its entirety by reference.

TECHNICAL FIELD

The present disclosure relates to a field of semiconductors, and in particular relates to a memory device, a method of manufacturing the memory device, and an electronic apparatus including the memory device.

BACKGROUND

Dynamic Random Access Memory (DRAM) generally uses a capacitor as a memory element. For example, one (1) transistor (T) as a switching device and one (1) capacitor (C) as a memory element are provided in a common 1T1C configuration. However, as a size of the memory device is further reduced, an area for fabricating the capacitor is gradually reduced, thus it is difficult to ensure that the capacitor has a sufficiently large capacitance to hold data.

A 3T0C configuration DRAM without a capacitor has been proposed. Three transistors are provided in such configuration, and a gate capacitance of the transistor may replace the capacitor as a memory element. However, the 3T0C configuration may occupy a relatively large area.

SUMMARY

In view of the above, an object of the present disclosure is at least partially to provide an area-saving memory device, a method of manufacturing the memory device, and an electronic apparatus including the memory device.

According to an aspect of the present disclosure, a memory device is provided, including: a first connection line layer, a second connection line layer, a third connection line layer, and a fourth connection line layer that are sequentially disposed in a vertical direction with respect to a substrate, wherein the first connection line layer includes a plurality of first conductive lines extending parallel to each other in a first direction, one of the second connection line layer and the third connection line layer includes a plurality of conductive lines extending parallel to each other in a second direction intersecting the first direction, and the fourth connection line layer includes a plurality of fourth conductive lines extending parallel to each other in a third direction; a plurality of memory cells, wherein each memory cell extends vertically from a corresponding first conductive line in the first connection line layer and respectively forms electrical connections with the second connection line layer or a corresponding conductive line in the second connection line layer, the third connection line layer or a corresponding conductive line in the third connection line layer, and a corresponding fourth conductive line in the fourth connection line layer, and each memory cell includes a first transistor, a second transistor, and a third transistor that are stacked on each other in the vertical direction, wherein the first transistor includes: a first active layer, including a first source/drain region electrically connected with the second connection line layer or the corresponding conductive line in the second connection line layer, a second source/drain region, and a channel region between the first source/drain region of the first transistor and the second source/drain region of the first transistor in the vertical direction; a first gate dielectric layer on the first active layer; and a first gate conductor layer on the first gate dielectric layer, wherein the first gate conductor layer extends towards the corresponding first conductive line in the first connection line layer to be electrically connected to the corresponding first conductive line in the first connection line layer, wherein the second transistor includes: a second active layer, including a first source/drain region, a second source/drain region electrically connected with the third connection line layer or the corresponding conductive line in the third connection line layer, and a channel region between the first source/drain region of the second transistor and the second source/drain region of the second transistor in the vertical direction, wherein the second source/drain region of the first transistor and the first source/drain region of the second transistor are close to each other and electrically connected with each other; a second gate dielectric layer on the second active layer; and a second gate conductor layer on the second gate dielectric layer, wherein the second gate conductor layer and the first gate conductor layer are electrically isolated from each other, and wherein the third transistor includes: a third active layer, including a first source/drain region electrically connected with the second gate conductor layer, a second source/drain region electrically connected with the corresponding fourth conductive line in the fourth connection line layer, and a channel region between the first source/drain region of the third transistor and the second source/drain region of the third transistor in the vertical direction; a third gate dielectric layer on the third active layer; and a third gate conductor layer on the third gate dielectric layer. The memory device further includes a fifth connection line layer above the memory cell, including a plurality of fifth conductive lines extending in a fourth direction intersecting the third direction, wherein the third gate conductor layer of each memory cell is electrically connected to a corresponding fifth conductive line in the fifth connection line layer.

According to another aspect of the present disclosure, a method of manufacturing a memory device is provided, including: forming a first isolation layer on a substrate; forming a first connection line layer on the first isolation layer, and patterning the first connection line layer as a plurality of first conductive lines extending parallel to each other in a first direction; sequentially forming a second isolation layer, a second connection line layer, a third isolation layer, and a third connection line layer on the first isolation layer and the first connection line layer, wherein one of the second connection line layer and the third connection line layer is patterned as a plurality of conductive lines extending parallel to each other in a second direction intersecting the first direction; forming a fourth isolation layer on the third connection line layer; forming a fourth connection line layer on the fourth isolation layer, and patterning the fourth connection line layer as a plurality of fourth conductive lines extending parallel to each other in a third direction; forming a fifth isolation layer on the fourth isolation layer and the fourth connection line layer; forming a plurality of vertically extending openings at intersections of corresponding conductive lines in the first connection line layer, the second connection line layer, the third connection line layer, and the fourth connection line layer; forming, in each opening, a first transistor, a second transistor and a third transistor that are stacked on each other in a vertical direction, so as to form a memory cell, wherein the first transistor includes: a first active layer, including a first source/drain region electrically connected with the second connection line layer or a corresponding conductive line in the second connection line layer, a second source/drain region, and a channel region between the first source/drain region of the first transistor and the second source/drain region of the first transistor in the vertical direction; a first gate dielectric layer on the first active layer; and a first gate conductor layer on the first gate dielectric layer, wherein the first gate conductor layer extends towards a corresponding first conductive line in the first connection line layer and is electrically connected to the corresponding first conductive line in the first connection line layer, wherein the second transistor includes: a second active layer, including a first source/drain region, a second source/drain region electrically connected with the third connection line layer or a corresponding conductive line in the third connection line layer, and a channel region between the first source/drain region of the second transistor and the second source/drain region of the second transistor in the vertical direction, wherein the second source/drain region of the first transistor and the first source/drain region of the second transistor are electrically connected with each other; a second gate dielectric layer on the second active layer; and a second gate conductor layer on the second gate dielectric layer, wherein the second gate conductor layer and the first gate conductor layer are electrically isolated from each other, and wherein the third transistor includes: a third active layer, including a first source/drain region electrically connected with the second gate conductor layer, a second source/drain region electrically connected with a corresponding fourth conductive line in the fourth connection line layer, and a channel region between the first source/drain region of the third transistor and the second source/drain region of the third transistor in the vertical direction; a third gate dielectric layer on the third active layer; and a third gate conductor layer on the third gate dielectric layer. The method further includes forming a fifth connection line layer on the fifth isolation layer, wherein the fifth connection line layer includes a plurality of fifth conductive lines extending in a fourth direction intersecting the third direction, wherein the third gate conductor layer of each memory cell is electrically connected to a corresponding fifth conductive line in the fifth connection line layer.

According to another aspect of the present disclosure, an electronic apparatus including the memory device described above is provided.

According to embodiments of the present disclosure, a memory device is provided, wherein transistors constituting a memory cell are stacked on each other, so as to save area. In particular, transistors stacked on each other in each memory cell may be self-aligned in a vertical direction.

BRIEF DESCRIPTION OF THE DRAWINGS

The above and other objectives, features and advantages of the present disclosure will be more apparent through the following descriptions of embodiments of the present disclosure with reference to the accompanying drawings, in which:

FIG. 17(*a*) and FIG. 17(*b*) schematically show equivalent circuit diagrams of a memory cell according to an embodiment of the present disclosure, in which:

FIGS. 1(*a*), 4(*a*), 7(*a*), 11(*a*), and 13(*a*) are top views, and positions of line AA' and line BB' are shown in FIG. 1(*a*), FIGS. 1(*b*), 5, 6(*a*), 7(*b*), 11(*b*), 12(*a*), 13(*b*), 14(*a*), and 15(*a*) are cross-sectional views along line AA', FIGS. 2, 3, 4(*b*), 6(*b*), 7(*c*), 8-10, 11(*c*), 12(*b*), 13(*c*), 14(*b*), 15(*b*), and 16 are cross-sectional views along line BB', and FIG. 14(*c*) is a cross-sectional view of a gate length control layer.

Throughout the accompanying drawings, the same or similar reference numerals indicate the same or similar components.

DETAILED DESCRIPTION OF EMBODIMENTS

Figure 1A:
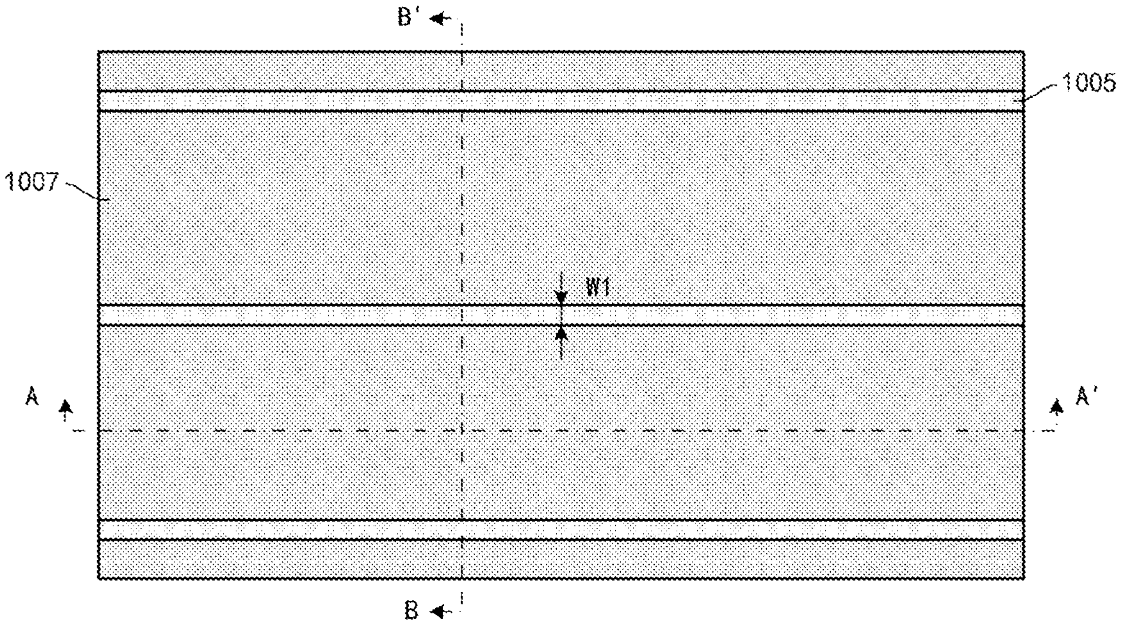
FIG. 1(*a*) to FIG. 13(*c*) show schematic diagrams of some stages in a process of manufacturing a memory device according to an embodiment of the present disclosure.

Embodiments of the present disclosure will be described below with reference to the accompanying drawings. However, it should be understood that the descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to embodiments of the present disclosure are shown in the accompanying drawings. The drawings are not drawn to scale. Some details are enlarged and some details may be omitted for clarity of presentation. Shapes of various regions and layers as well as relative sizes and positional relationships of the various regions shown in the drawings are only exemplary. In practice, there may be deviations due to manufacturing tolerances or technical limitations, and those skilled in the art may additionally design regions/layers with different shapes, sizes, and relative positions according to actual requirements.

In the context of the present disclosure, when a layer/element is referred to as being "on" a further layer/element, the layer/element may be directly on the further layer/element, or there may be an intermediate layer/element between them. In addition, if a layer/element is located "on" a further layer/element in one orientation, the layer/element may be located "under" the further layer/element when the orientation is reversed.

A memory device according to embodiments of the present disclosure is based on a vertical device. The vertical device may include a vertical active region with respect to a substrate, including source/drain regions located at upper and lower ends of the vertical active region and a channel region located between the source/drain regions. A conductive channel may be formed between the source/drain regions through the channel region.

According to the embodiments of the present disclosure, a position of a source/drain region in the active region may be defined through an electrode. For example, the active region may be defined by a semiconductor layer that extends substantially in a vertical direction (a direction substantially perpendicular to a surface of the substrate) (considering a manufacturing process, there may be a laterally extending bottom, as described below). Regions (e.g., regions at upper and lower ends of the semiconductor layer) in the semiconductor layer that are connected to the electrode may form source/drain regions, and a region between the source/drain regions may form a channel region. A gate conductor layer may face the channel region via a gate dielectric layer to control the channel region. The electrode may include a bit line, a word line or a ground plane, a gate length control pad, etc. of the memory device.

The memory device according to the embodiments of the present disclosure may be a Dynamic Random Access Memory (DRAM) and may have a capacitance free configuration, such as a 3T0C configuration. In the 3T0C configuration, each memory cell of the memory device may have three transistors, i.e., a first transistor (e.g., a selection transistor), a second transistor (e.g., a read transistor), and a third transistor (e.g., a write transistor). As described above, the three transistors may be vertical devices, and thus may be easily stacked on each other, thereby saving area. Each of the three transistors may be defined by a corresponding active region (combined with a corresponding gate stack), and may be self-aligned as described below. For example, portions (for example, the vertically extending semiconductor layer described above) where respective active layers of the three transistors are adjacent may be substantially aligned in the vertical direction. In addition, according to a connection relationship, an isolation portion may be provided between (active regions of) the transistors to achieve electrical isolation. As described below, the isolation portion may also be self-aligned. A self-aligning configuration may further save area. According to the embodiments of the present disclosure, a DRAM with a memory cell area of 4F2 may be implemented.

According to the embodiments of the present disclosure, a plurality of connection line layers at different levels may be provided to respectively define source/drain regions at different heights of the active region. For example, a first connection line layer, a second connection line layer, a third connection line layer and a fourth connection line layer may be provided, which include conductive materials, and may be respectively patterned as corresponding conductive lines (the connection line layer may not be patterned when the connection line layer is used as the ground plane). A memory cell may be formed at an intersection of conductive lines in different connection line layers.

The first connection line layer may be disposed below the first transistor to define a gate electrode of the first transistor. The second connection line layer may be disposed at a vertical height of a lower end of the active region of the first transistor to define a lower source/drain region of the first transistor. The third connection line layer may be disposed at a vertical height of an upper end of an active region of the second transistor to define an upper source/drain region of the second transistor. The fourth connection line layer may be disposed at a vertical height of an upper end of an active region of the third transistor to define an upper source/drain region of the third transistor.

In a case of 3T0C configuration, the upper source/drain region of the first transistor and the lower source/drain region of the second transistor may be electrically connected to each other, which may be achieved by a continuously extending active region between the first transistor and the second transistor, without additionally providing a corresponding connection line layer. In addition, a gate electrode of the second transistor may be electrically connected to a source/drain region (e.g., a lower source/drain region) of the third transistor. Therefore, the lower source/drain region of the third transistor may be defined through a gate conductor layer of the second transistor without additionally providing a corresponding connection line layer. In addition, a fifth connection line layer including a corresponding conductive line may also be provided to achieve an electrical connection to a gate electrode of each third transistor. In the case of the 3T0C configuration, the conductive line in the first connection line layer may be a read word line (RWL), (the conductive line in) the second connection line layer may be one of a read bit line (RBL) and a ground plane, (the conductive line in) the third connection line layer may be the other of the read bit line (RBL) and the ground plane, the conductive line in the fourth connection line layer may be a write bit line (WBL), and the conductive line in the fifth connection line layer may be a write word line (WWL). For ease of addressing, RWL and RBL may extend in directions that intersect (e.g., perpendicular to) each other, and WBL and WWL may extend in directions that intersect (e.g., perpendicular to) each other. In addition, in order to facilitate a fabrication of an array, conductive lines in connection line layers adjacent in the vertical direction may extend in directions that intersect (e.g., perpendicular to) each other.

Each memory cell may be formed to vertically extend to form an electrical connection with each connection line layer, respectively. For example, each memory cell may extend vertically to pass through these connection line layers (the second to fourth connection line layers described above, and the memory cell may not pass through the lowest first connection line layer used to define the gate electrode) used to define the source/drain regions. That is, each memory cell may be formed in an opening at an intersection of the conductive lines. Active regions of the first transistor and the second transistor may be continuous with each other as described above, and thus may be implemented by a same semiconductor layer (hereinafter, referred to as a "first active layer"). The first active layer may be formed along a sidewall of the opening and thus may have a ring shape. A first gate dielectric layer of the first transistor may extend along an inner wall of a lower portion of the first active layer, and an inner space of the first gate dielectric layer may be filled with a first gate conductor layer. A second gate dielectric layer of the second transistor may extend along an inner wall of an upper portion of the first active layer, and an inner space of the second gate dielectric layer may be filled with a second gate conductor layer. The first gate conductor layer and the second gate conductor layer may be electrically isolated from each other (for example, through the second gate dielectric layer). A semiconductor layer (hereinafter referred to as a "second active layer") used as an active region in the third transistor may be formed along the sidewall of the opening, and may further extend along a top portion of the second transistor due to a manufacturing process. Accordingly, the second active layer may be in a cup shape. A third gate dielectric layer of the third transistor may extend along an inner wall of the cup-shaped second active layer, and an inner space of the third gate dielectric layer may be filled with a third gate conductor layer. The three transistors may be formed in an opening formed based on a same mask, and thus may be self-aligned with each other. For example, portions where respective outer sidewalls of the three transistors are adjacent may be substantially coplanar in the vertical direction (defined by the inner sidewall of the opening).

The first transistor, the second transistor and the third transistor may be in substantially the same or similar forms: a ring-shaped (or cup-shaped due to manufacturing process) active layer; a gate stack (including a gate dielectric layer and a gate conductor layer) disposed on an inner side of the active layer; and a connection line layer disposed outside the active layer, to define the source/drain region. Respective active layers and gate stacks of the first transistor, the second transistor and the third transistor may have the same configuration, but may also have different configurations to further optimize device performance. For example, the first active layer may include a semiconductor material with a relatively high mobility to reduce a read time (or increase a read speed) when the second transistor is used as a read transistor; while the second active layer may include a semiconductor material with a relatively low leakage or a relatively large bandgap width to increase a data retention capability when the third transistor is used as a write transistor.

In order to achieve an electrical isolation between the first active layer and the second active layer, an isolation portion may be provided between the first active layer and the second active layer. Such isolation portion may be achieved as a spacer formed on the sidewall of the opening, and thus may be self-aligned between the first active layer and the second active layer. Here, the isolation portion may expose the second gate conductor layer to achieve an electrical connection between the lower source/drain region of the third transistor and the gate electrode of the second transistor as described above. For example, the second active layer may be in direct physical contact with the second gate conductor layer. On the one hand, due to a presence of the second gate conductor layer, a lower source/drain region is defined at a corresponding position of the second active layer. On the other hand, the direct physical contact between the second active layer and the second gate conductor layer achieves the electrical connection between the lower source/drain region of the third transistor and the gate electrode of the second transistor. Alternatively, a connection portion such as a metal may be additionally provided between the second active layer and the second gate conductor layer to reduce a contact resistance between the two.

For example, such memory device may be manufactured as follows.

A plurality of isolation layers and a plurality of connection line layers, e.g., the first isolation layer, the first connection line layer, the second isolation layer, the second connection line layer, the third isolation layer, the third connection line layer, the fourth isolation layer, the fourth connection line layer, and the fifth isolation layer, may be alternately disposed on the substrate. As described above, each connection line layer (except for the connection line layer used as the ground plane) may be patterned as a corresponding conductive line. Openings may be formed at intersections of the conductive lines, so that the openings may pass through each connection line layer in the vertical direction (and may stop at the lowest first connection line layer). The memory cell may be formed in each opening. As described above, each memory cell may include a first transistor, a second transistor and a third transistor that are stacked on each other. The transistor may be formed by sequentially forming the corresponding active layer, gate dielectric layer, and gate conductor layer in the opening. After forming the second transistor and before forming the third transistor, an isolation portion may be formed on a sidewall of the opening through a spacer process, so as to shield a top end of the first active layer. In addition, after forming the isolation portion and before forming the third transistor, a connection portion (e.g., a metal) that is in physical contact with the second gate conductor layer may further be formed on the second transistor in the opening. In addition, a fifth connection line layer including a corresponding conductive line may further be formed on the fifth isolation layer, so as to achieve an electrical connection to the gate electrode of each third transistor.

The present disclosure may be presented in various forms, some examples of which will be described below. In the following description, a selection of various materials is involved. In the selection of materials, in addition to a function of the material (for example, a semiconductor material may be used to form the active region, a dielectric material may be used to form an electrical isolation, and a conductive material may be used to form an electrode, an interconnection structure, and the like), the etching selectivity is also considered. In the following description, the required etching selectivity may or may not be indicated. It should be clear to those skilled in the art that when etching a material layer is mentioned below, if it is not mentioned or shown that other layers are also etched, then the etching may be selective, and the material layer may have an etching selectivity with respect to other layers exposed to the same etching recipe.

Figure 1B:
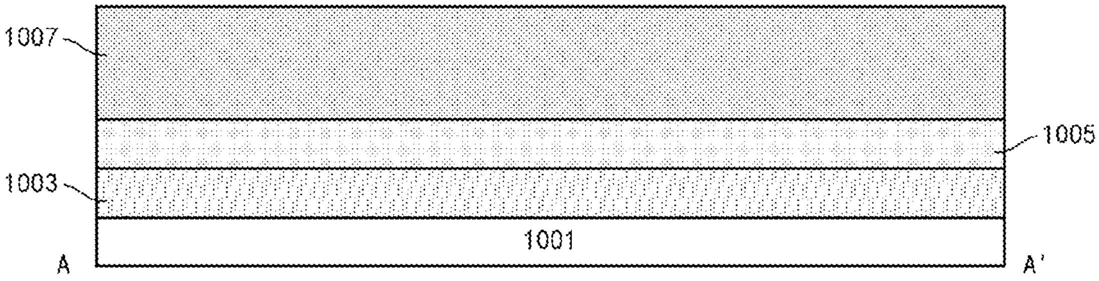
Figure 13A:
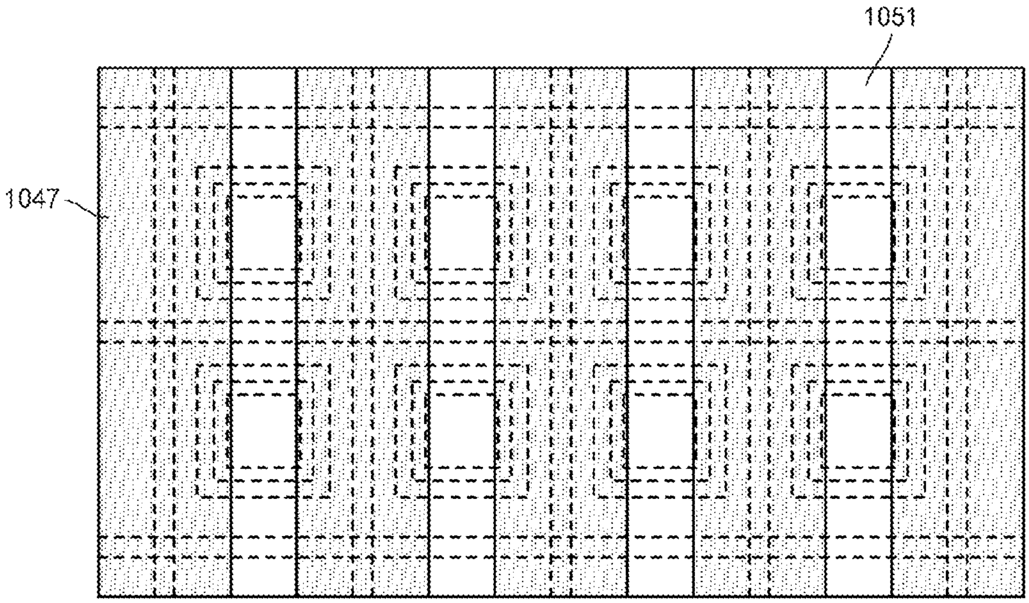
Figure 13B:
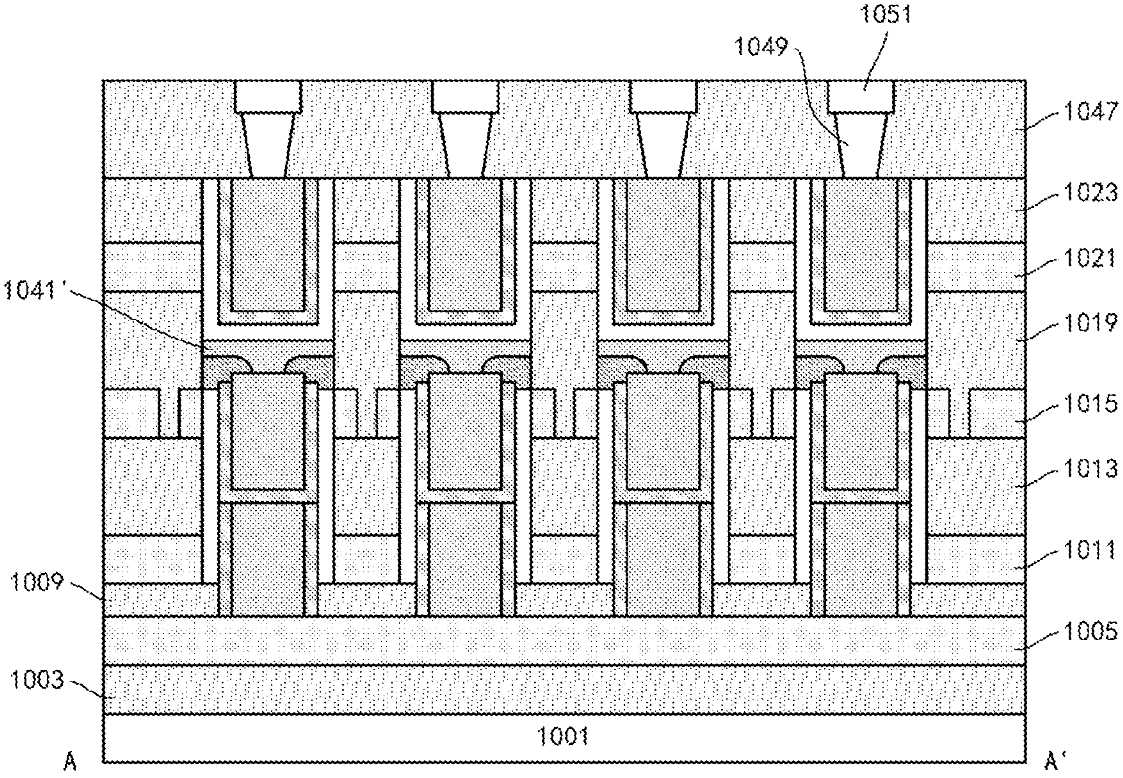
Figure 13C:
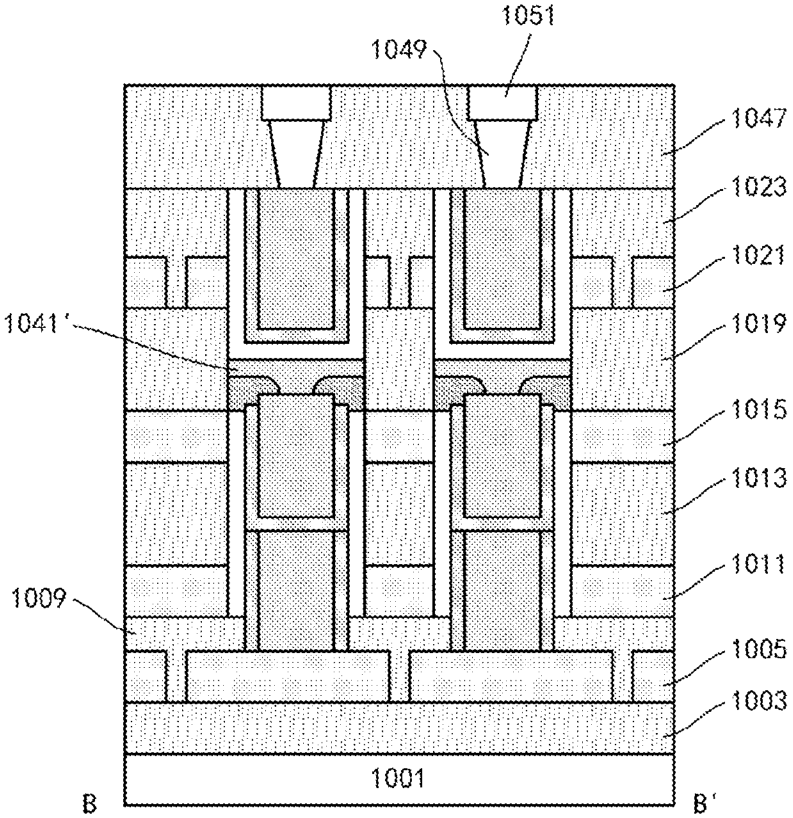

FIG. 1(*a*) to FIG. 13(*c*) show schematic diagrams of some stages in a process of manufacturing a memory device according to an embodiment of the present disclosure.

As shown in FIG. 1(*a*) and FIG. 1(*b*), a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following description, for convenience of explanation, the bulk Si substrate such as a Si wafer is taken as an example for description.

On the substrate 1001, a first isolation layer 1003 and a first connection line layer 1005 may be formed, for example, by deposition. The first isolation layer 1003 may include a dielectric material such as an oxide (e.g., silicon oxide) to achieve electrical isolation, and have a thickness of, for example, about 20 nm to 200 nm. The first connection line layer 1005 may include a conductive material such as a metal, e.g., molybdenum (Mo), ruthenium (Ru), and the like, and have a thickness of, for example, about 5 nm to 100 nm. As described below, the first connection line layer 1005 may define RWL. As bit lines or word lines, there may be several conductive lines that extend parallel in a certain direction.

To this end, as shown in FIG. 1(*a*) and FIG. 1(*b*), a photoresist 1007 may be formed on the first connection line layer 1005 and patterned as lines extending in a first direction (a horizontal direction on a paper plane in FIG. 1(*a*)) by photolithography. A line width of the lines may be about 20 nm to 500 nm, and a spacing W1 between the lines may be about 10 nm to 50 nm.

Figure 2:
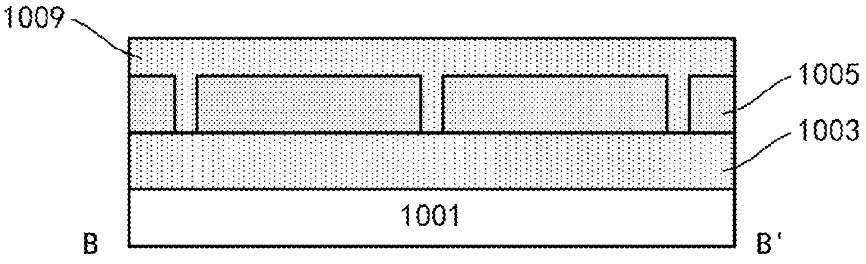

As shown in FIG. 2, selective etching, such as reactive ion etching (RIE) in the vertical direction, may be performed on the first connection line layer 1005 with the patterned photoresist 1007 as a mask. The RIE may stop at the first isolation layer 1003 below. Accordingly, the first connection line layer 1005 may be patterned as a pattern corresponding to the photoresist 1007, i.e., first conductive lines extending parallel in the first direction. After that, the photoresist 1007 may be removed.

On the first connection line layer 1005, a second isolation layer 1009 may be formed, for example, by deposition. The second isolation layer 1009 may include a dielectric material such as an oxide, a nitride (e.g., silicon nitride), a carbide (e.g., silicon carbide), and the like to achieve electrical isolation. Here, a deposition thickness of the second isolation layer 1009 may be controlled to be greater than W1/2, so as to fill a spacing between the first conductive lines in the first connection line layer 1005 and achieve a sufficiently flat top surface to avoid a use of a planarization process such as a chemical mechanical polishing (CMP). Avoiding the use of the planarization process may allow a thickness (especially a thickness of the second isolation layer 1009 on the first connection line layer 1005) of the second isolation layer 1009 to be better controlled. For example, the thickness of the second isolation layer 1009 (on the first connection line layer 1005) may be about 10 nm to 100 nm.

Figure 3:
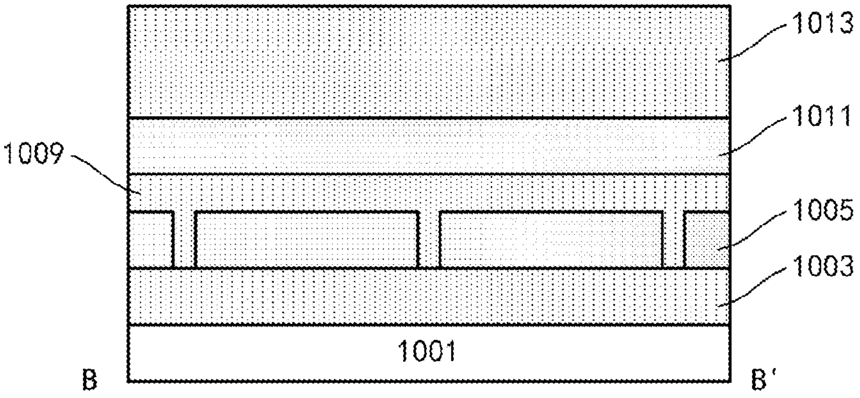

As shown in FIG. 3, a second connection line layer 1011 and a third isolation layer 1013 may be formed on the second isolation layer 1009, for example, by deposition. The second connection line layer 1011 may include a conductive material such as a metal, e.g., Mo, Ru, and the like, and have a thickness of, e.g., about 5 nm to 20 nm. As described below, the second connection line layer 1011 may define the ground plane. For the memory device, the ground may be common, thus the second connection line layer 1011 does not need to be patterned as separate portions corresponding to each memory cell, but may be continuously extended to form an integrated conductive plate. Certainly, the present disclosure is not limited to this. For example, the second connection line layer 1011 may also be patterned into several separate portions, such as several conductive lines (e.g., conductive lines extending in the first direction described above or a second direction described below), or several conductive plates (e.g., conductive blocks arranged in an array in the first direction described above and the second direction described below), which may be connected in common to the ground. The third isolation layer 1013 may include a dielectric material such as an oxide, a nitride, a carbide, and the like to achieve electrical isolation, and have a thickness, for example, about 20 nm to 200 nm. A thickness of the third isolation layer 1013 may at least partially define gate lengths (or channel lengths) of the first transistor and the second transistor.

Figure 4A:
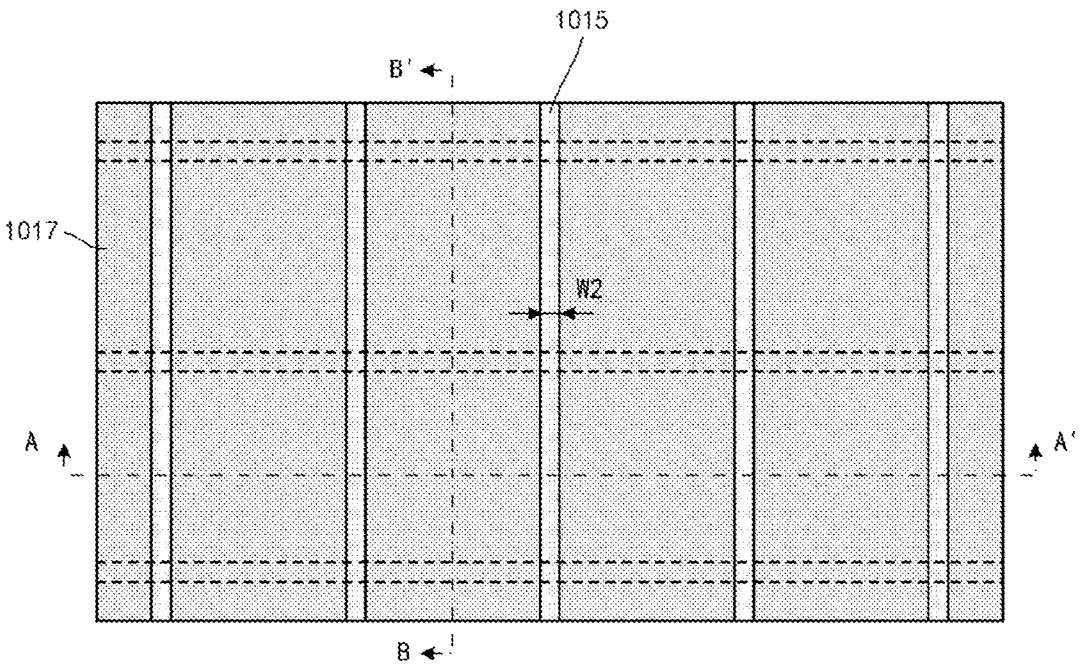
Figure 4B:
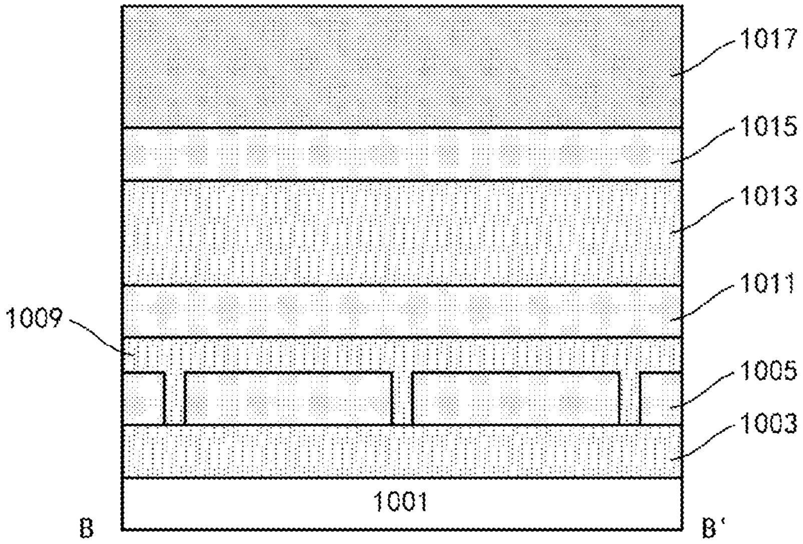

As shown in FIG. 4(*a*) and FIG. 4(*b*), a third connection line layer 1015 may be formed on the third isolation layer 1013, for example, by deposition. Similarly, the third connection line layer 1015 may include a conductive material such as a metal, e.g., Mo, Ru, and the like, and have a thickness of, e.g., about 5 nm to 20 nm. As described below, the third connection line layer 1015 may define RBL. In order to facilitate addressing of an array of memory cells, the RBL defined by the third connection line layer 1015 may be formed as a conductive line extending in a direction that intersects (e.g., perpendicular to) the RWL defined by the first connection line layer 1015.

To this end, as shown in FIG. 4(*a*) and FIG. 4(*b*), a photoresist 1017 may be formed on the third connection line layer 1015 and patterned as lines extending in a second direction (a vertical direction on a paper plane in FIG. 4(*a*)) that intersects (e.g., perpendicular to) the first direction by photolithography. A line width of the lines may be about 20 nm to 500 nm, and a spacing W2 between the lines may be about 10 nm to 50 nm.

Figure 5:
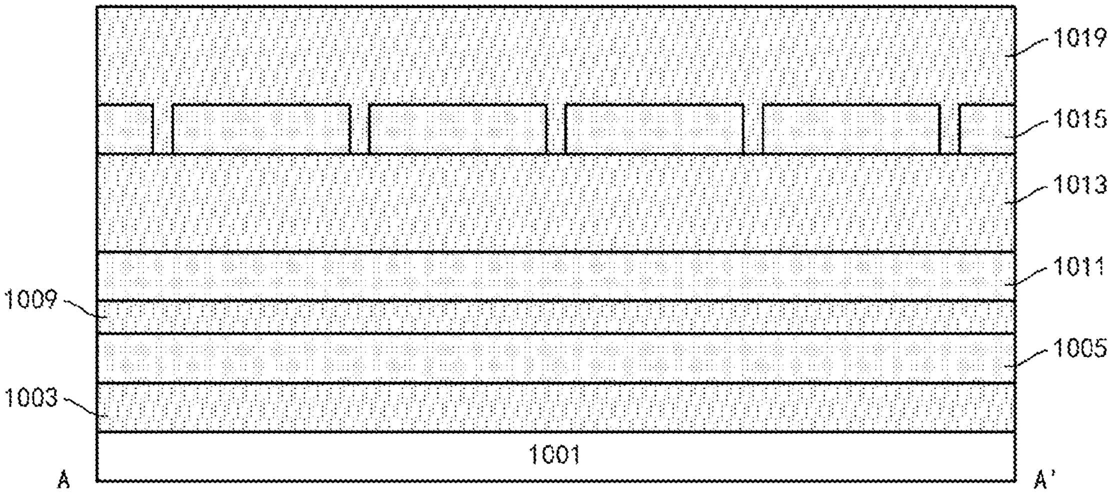

As shown in FIG. 5, selective etching, such as RIE in the vertical direction, may be performed on the third connection line layer 1015 with the patterned photoresist 1017 as a mask. The RIE may stop at the third isolation layer 1013 below. Accordingly, the third connection line layer 1015 may be patterned as a pattern corresponding to the photoresist 1017, i.e., third conductive lines extending parallel in the second direction. After that, the photoresist 1017 may be removed.

A fourth isolation layer 1019 may be formed on the third connection line layer 1015, for example, by deposition. The fourth isolation layer 1019 may include a dielectric material such as an oxide, a nitride, a carbide, and the like to achieve electrical isolation. Similarly, a deposition thickness of the fourth isolation layer 1019 may be controlled to be greater than W2/2, so as to fill a spacing between the third conductive lines in the third connection line layer 1015 and achieve a sufficiently flat top surface to avoid the use of the planarization process. Avoiding the use of the planarization process may allow a thickness (especially a thickness of the fourth isolation layer 1019 on the third connection line layer 1015) of the fourth isolation layer 1019 to be better controlled, as the thickness of the fourth isolation layer 1019 may then at least partially define a gate length (or a channel length) of the third transistor. For example, the thickness of the fourth isolation layer 1019 (on the third connection line layer 1015) may be about 20 nm to 200 nm.

Figure 6A:
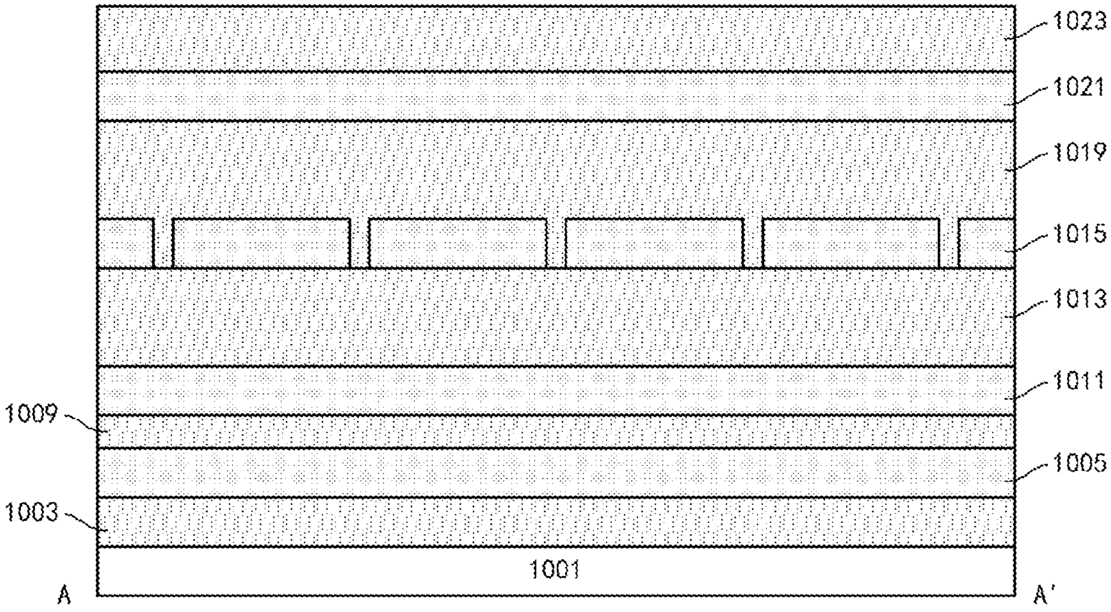
Figure 6B:
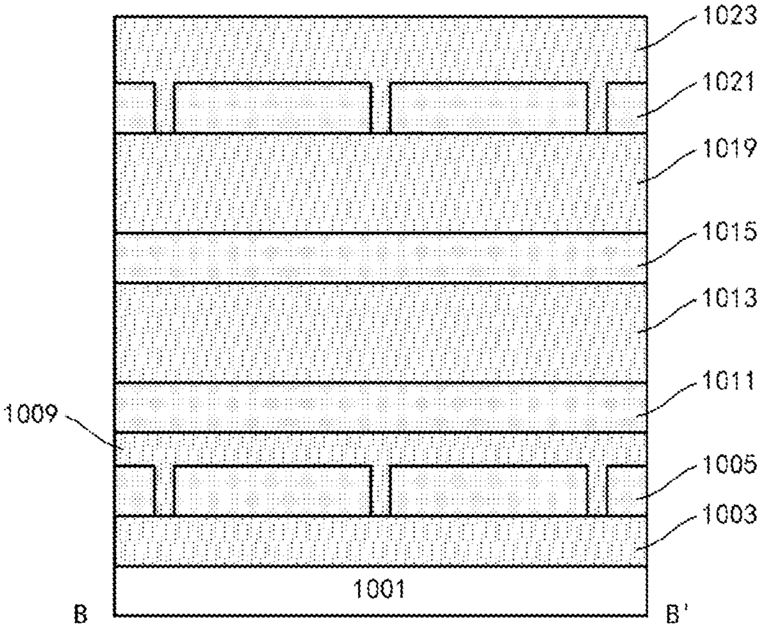

As shown in FIG. 6(*a*) and FIG. 6(*b*), a fourth connection line layer 1021 and a fifth isolation layer 1023 may be formed on the fourth isolation layer 1019. The fourth connection line layer 1021 may include a conductive material such as a metal, e.g., Mo, Ru, and the like, and have a thickness of, for example, about 5 nm to 20 nm. As described below, the fourth connection line layer 1021 may define WBL. The WBL may be several conductive lines that extend parallel in a certain direction, such as a third direction. The third direction may be the same as the first direction or the second direction described above (which is convenient for fabrication, for example, a same mask may be used), or the third direction may also be different from the first direction and the second direction.

In this example, the fourth connection line layer 1021 is shown as substantially the same pattern as the first connection line layer 1005, and for example, the same mask may be used. Therefore, the above description in conjunction with FIG. 1(*a*), FIG. 1(*b*), and FIG. 2 may be referred for the pattern of the fourth connection line layer 1021, which will not be repeated here. However, the present disclosure is not limited to this. As long as there are overlapping portions between the conductive lines in the connection line layers in the vertical direction, it is possible to form openings in the overlapping portions and form memory cells within the openings as described below.

The fifth isolation layer 1023 may include a dielectric material such as an oxide, a nitride, a carbide, and the like to achieve electrical isolation. The fifth isolation layer 1023 may be formed by using the same process as the second isolation layer 1009. Therefore, the above description in conjunction with FIG. 2 may be referred for the formation of the fifth isolation layer 1023, which will not be repeated here.

Through the above processes, conductive lines (bit lines or word lines) that intersect each other are formed, and the memory cell may be formed at the intersection of the conductive lines. More specifically, the conductive lines that intersect each other define regions arranged in an array on the substrate, and the memory cells (three transistors may be formed in the 3T0C configuration) may be formed in the regions.

Spaces for active regions of the transistors in the memory cells may be defined in the regions.

Figure 7A:
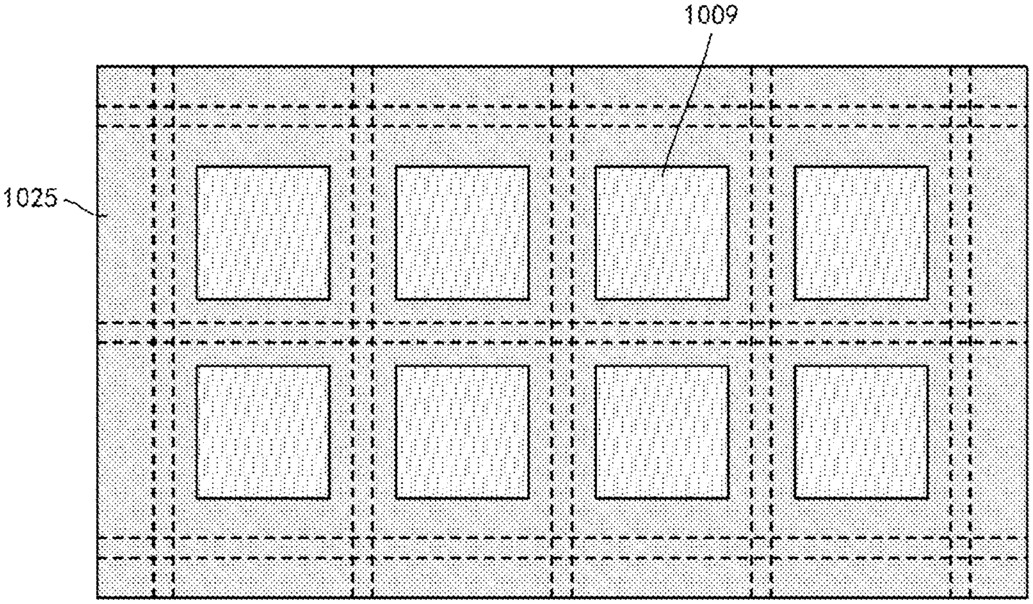
Figure 7B:
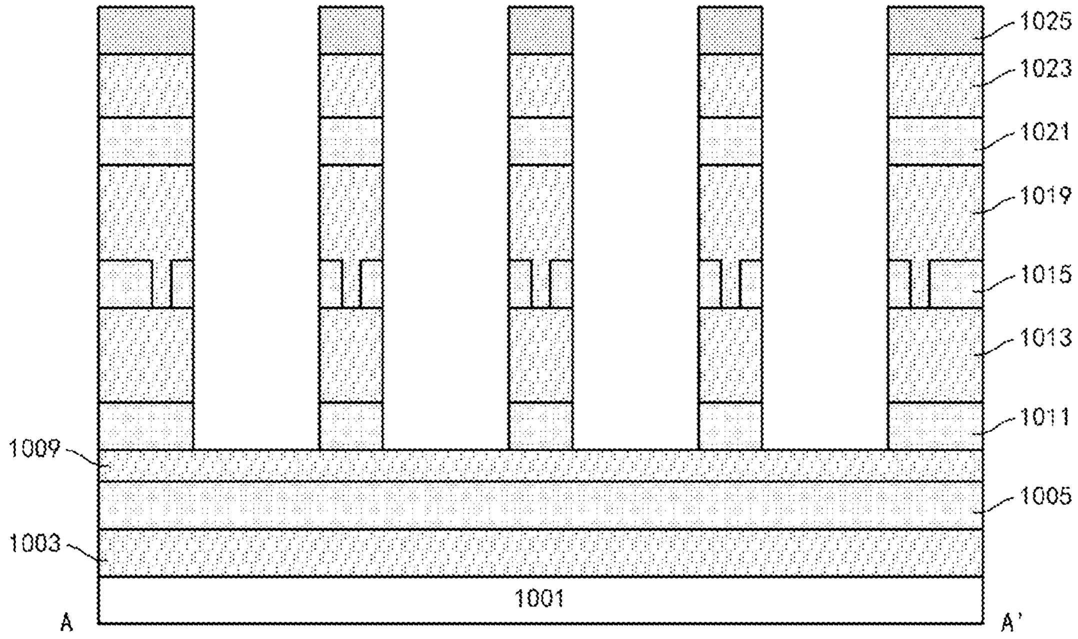
Figure 7C:
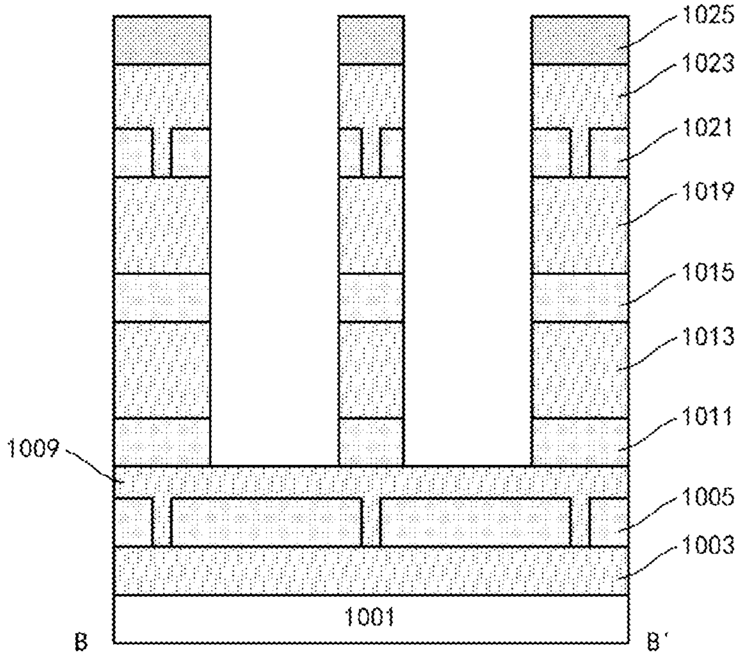

For example, as shown in FIG. 7(*a*), FIG. 7(*b*), and FIG. 7(*c*), a photoresist 1025 may be formed on the fourth isolation layer 1023. The photoresist 1025 may be patterned as a series of openings by photolithography to expose regions where the conductive lines intersect each other. Although the opening in the photoresist 1025 is shown as square, a shape of the opening is not limited to this. The shape of the opening may include various other shapes suitable for manufacturing, such as rectangular, circular, and the like.

Selective etching, such as RIE in the vertical direction, may be performed on underlying layers with the patterned photoresist 1025 as a mask. The RIE may stop at the second isolation layer 1009. After that, the photoresist 1025 may be removed.

In this way, each of the conductive lines in the second connection line layer 1011, the third connection line layer 1015, and the fourth connection line layer 1021 has an opening corresponding to the photoresist 1025, and the openings are arranged in an array. In this example, each conductive line remains continuously extending in the first direction or the second direction, and is not completely disconnected by the opening. In particular, each conductive line has a material that continuously extends around a periphery of the opening. However, the present disclosure is not limited to this. For example, for at least some conductive lines, the opening may not be completely surrounded by the corresponding conductive line (for example, the corresponding conductive line may be biased on one side of the opening, thereby only surrounding a portion of a sidewall of the opening).

Three vertical transistors that are stacked on each other may be formed in each opening.

Figure 8:
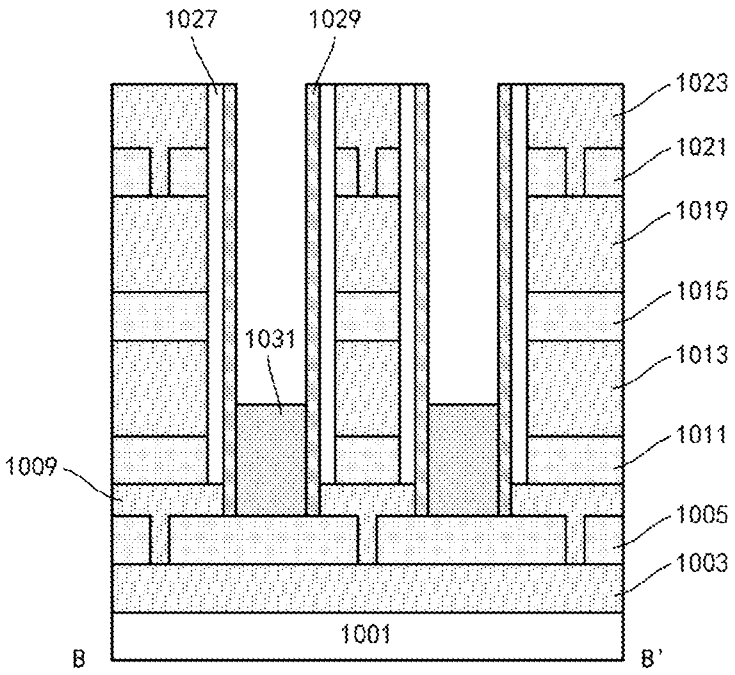

For example, as shown in FIG. 8, a first active layer 1027 may be formed in a substantially conformal manner by deposition such as direct current (DC) magnetron sputtering, radio frequency (RF) magnetron sputtering, atomic layer deposition (ALD), and the like. The first active layer 1027 may include a semiconductor material to define an active region of a first transistor (e.g., a selection transistor). For example, the first active layer 1027 may include an oxide semiconductor, such as indium gallium zinc oxide (IGZO), and have a thickness of about 5 nm to 100 nm. A portion of the first active layer 1027 located at a bottom of the opening (as well as a portion of the first active layer 1027 located outside the opening) may be removed by selective etching, such as RIE in the vertical direction. Accordingly, the first active layer 1027 may be left on the sidewall of the opening. Due to an absence of an opening in the second isolation layer 1009 at this point, the first active layer 1027 formed may be electrically isolated from the first connection line layer 1005 defining the RWL (to be electrically connected to a gate electrode of the selection transistor).

In a case where the first active layer 1027 is present on the sidewall, the opening may be further deepened. For example, an opening may be formed in the second isolation layer 1009 through RIE (which may stop at the first connection line layer 1005) in the vertical direction. In the deepened opening, a first gate dielectric layer 1029 may be formed in a substantially conformal manner by deposition. A portion of the first gate dielectric layer 1029 located at the bottom of the opening (as well as a portion of the first gate dielectric layer 1029 located outside the opening) may be removed by selective etching, such as RIE in the vertical direction. For example, the first gate dielectric layer 1029 may include an oxide dielectric such as aluminum oxide ($Al_2O_3$), and have a thickness of about 2 nm to 30 nm. Then, a first gate conductor layer 1031 may be formed by deposition. A remaining space in each opening may be filled with the first gate conductor layer 1031. The first gate conductor layer 1031 may include a conductor such as a conductive nitride, e.g., titanium nitride (TiN), a metal, e.g., tungsten (W), a conductive oxide, e.g., indium zinc oxide (IZO), and the like. The first gate conductor layer 1031 may be etched back through wet etching, RIE, atomic layer etching (ALE), and the like, so that a top surface of the first gate conductor layer 1031 is lowered to a height between a top surface the second connection layer 1011 and a bottom surface of the third connection layer 1015.

As a result, the first transistor (e.g., the selection transistor) is formed in each opening. As shown in FIG. 8, each first transistor may include the first active layer 1027. The first active layer 1027 may extend along the sidewall of the opening to have a ring shape. A region in the first active layer 1027 that is connected to the second connection line layer 1011 may define the lower source/drain region of the first transistor. A region in the first active layer 1027, which is above the lower source/drain region of the first transistor and faces the first gate conductor layer 1031 via the first gate dielectric layer 1029, may define a channel region of the first transistor. A region in the first active layer 1027 above the channel region may define the upper source/drain region of the first transistor. A channel length or a gate length of the first transistor may be defined by a height of the first gate conductor layer 1031 above a top surface of the second connection line layer 1011.

Figure 9:
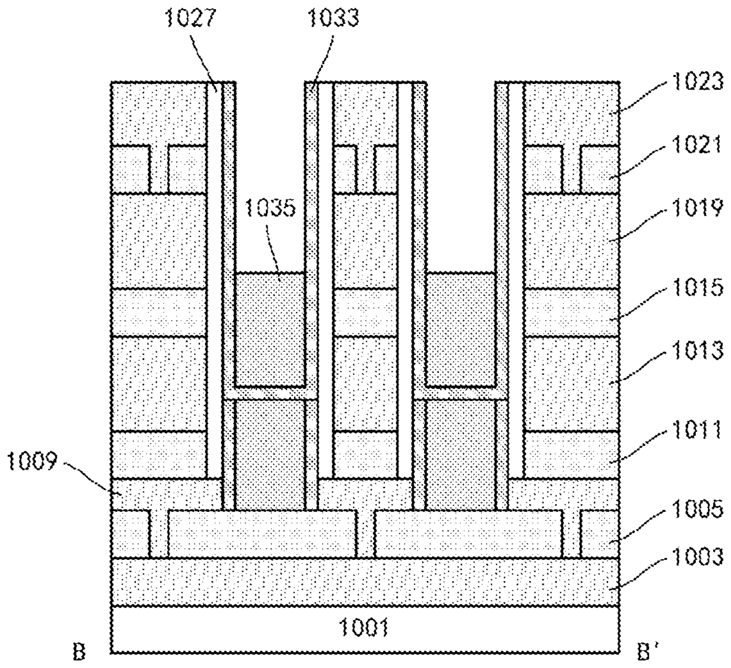

A second transistor (such as a read transistor) may be formed above the first transistor in the opening. For example, as shown in FIG. 9, the first gate dielectric layer 1029 may be selectively etched by, for example, wet etching, dry etching, ALE, and the like, with the etched first gate conductor layer 1031 as a mask. Then, a second gate dielectric layer 1033 and a second gate conductor layer 1035 may be formed similarly to the formation of the first transistor, except that a bottom portion of the second gate dielectric layer 1033 does not need to be etched to achieve an electrical isolation between the gate electrode of the first transistor and the gate electrode of the second transistor. Materials and thicknesses of the second gate dielectric layer 1033 and the second gate conductor layer 1035 may be the same as or different from materials and thicknesses of the first gate dielectric layer 1029 and the first gate conductor layer 1031. Here, a top surface of the second gate conductor layer 1035 may be etched back to a vicinity of a top surface of the third connection line layer 1015.

In this example, the first gate dielectric layer 1029 is selectively etched, and then the second gate dielectric layer 1033 is formed. However, the present disclosure is not limited to this. For example, the second gate dielectric layer 1033 may be formed on the first gate dielectric layer 1029 without etching the first gate dielectric layer 1029.

In addition, in this example, for the second transistor, an active layer is not additionally formed, while the same first active layer 1027 as the first transistor is utilized. However, the present disclosure is not limited to this. For example, the first active layer 1027 may be selectively etched (after selectively etching the first gate dielectric layer 1029 as described above) with the etched first gate conductor layer 1031 as a mask. Then, a process of forming the ring-shaped first active layer 1027 may be used to form a ring-shaped second active layer for the second transistor in each opening (a lower end of the second active layer may contact an upper end of the first active layer 1027). On the additionally formed second active layer, the second gate dielectric layer 1033 and the second gate conductor layer 1035 may be formed as described above. This may be advantageous when the first transistor and the second transistor need to be optimized differently.

As a result, the second transistor (e.g., a read transistor) is formed in each opening. As shown in FIG. 9, each second transistor may include the first active layer 1027. A region in the first active layer 1027 that is connected to the third connection line layer 1015 may define an upper source/drain region of the second transistor. A region in the first active layer 1027, which is below the upper source/drain region of the second transistor and faces the second gate conductor layer 1035 via the second gate dielectric layer 1033, may define a channel region of the second transistor. A region in the first active layer 1027 below the channel region may define a lower source/drain region of the second transistor. A channel length or a gate length of the second transistor may be defined by a height of the second gate conductor layer 1035 below the bottom surface of the third connection line layer 1015.

Accordingly, the upper source/drain region of the first transistor and the lower source/drain region of the second transistor may share a same region (for example, a region between the top surface of the first gate conductor layer 1031 and the bottom surface of the second gate conductor layer 1035 at a vertical height) in the first active layer 1027.

Figure 10:
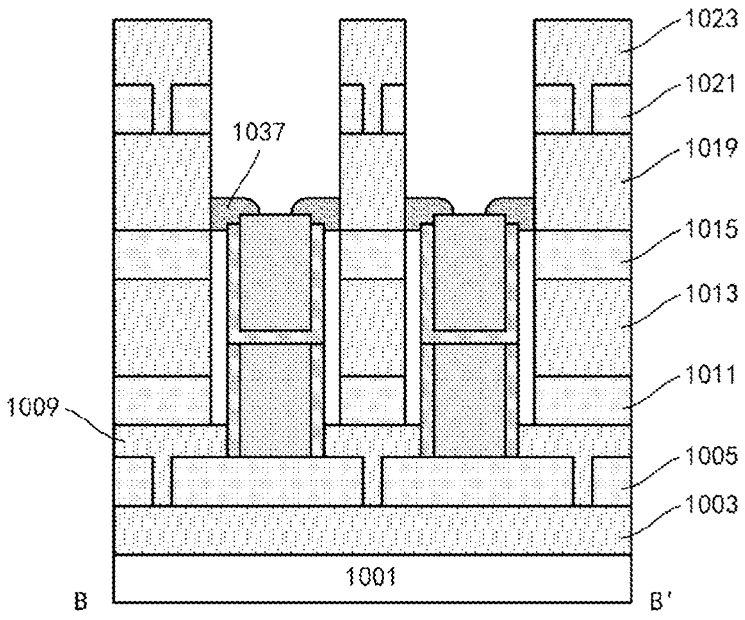

In addition, as shown in FIG. 10, the second gate dielectric layer 1033 and the first active layer 1027 may be respectively selectively etched by, for example, wet etching, dry etching, ALE, and the like, with the etched second gate conductor layer 1035 as a mask. The top surface of the first active layer 1027 may not exceed the top surface of the third connection line layer 1015.

A third transistor (e.g., a write transistor) may be formed above the second transistor in the opening. In order to achieve an isolation between the second transistor and the third transistor, especially an isolation between active regions, an isolation portion 1037 may be formed. Here, considering that the first active layer 1027 is along the sidewall of the opening, the isolation portion 1037 in a form of a spacer may be formed on the sidewall of the opening. For example, a layer of dielectric may be deposited in a substantially conformal manner, and then anisotropic etching such as RIE in the vertical direction may be performed on the deposited dielectric to remove a lateral extending portion of the deposited dielectric and leave a vertical extending portion of the deposited dielectric, so as to form the spacer. Considering the etching selectivity, for example, in a case that the previously formed isolation layers include an oxide, the isolation portion 1037 may include a nitride.

Here, the isolation portion 1037 is arranged along the sidewall of the opening, and the second gate conductor layer 1035 is exposed in a middle portion of the opening, so that the second gate conductor layer 1035 is subsequently electrically connected to the third transistor.

Figure 11A:
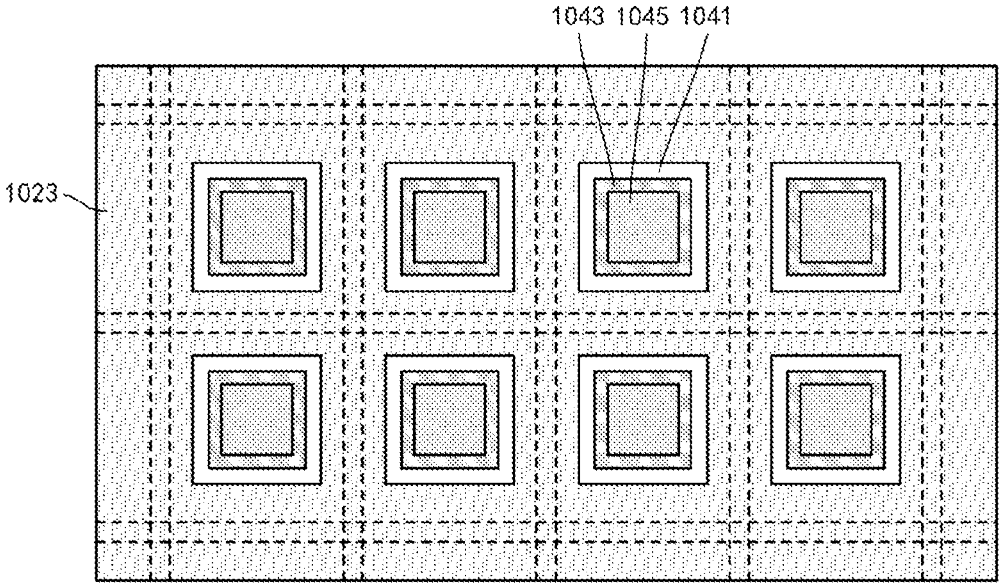
Figure 11B:
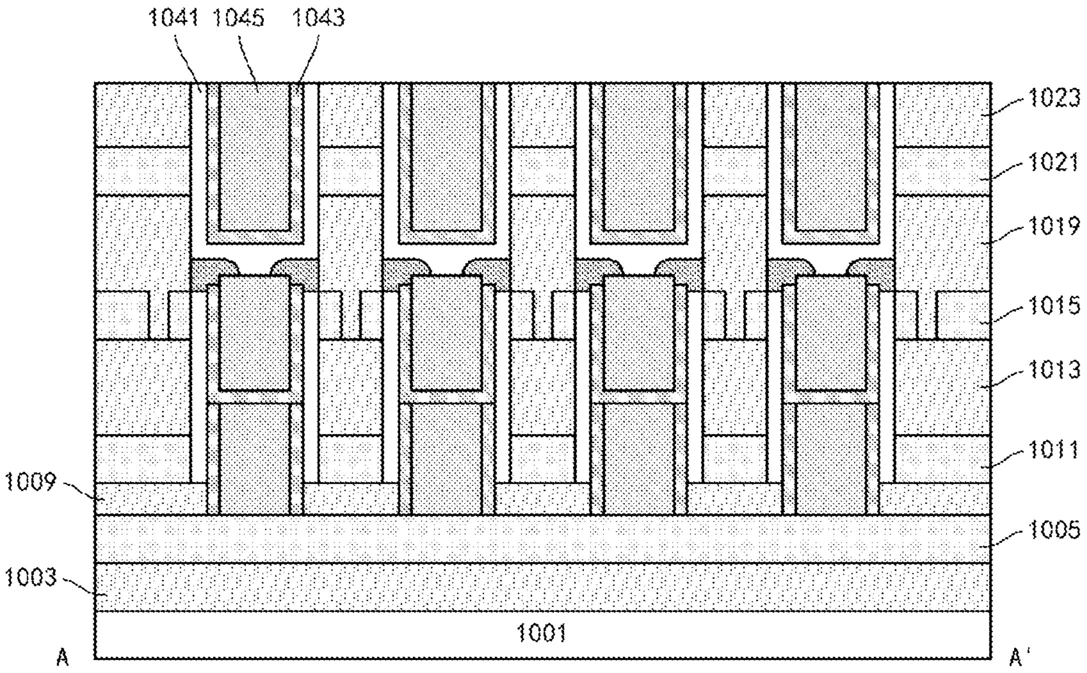
Figure 11C:
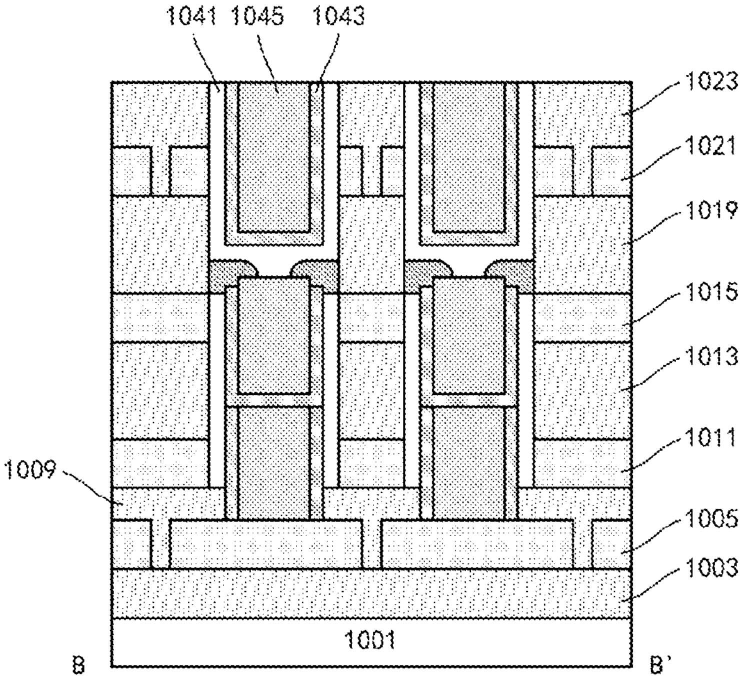

The third transistor may be similarly formed. For example, as shown in FIG. 11(*a*), FIG. 11(*b*), and FIG. 11(*c*), a third active layer 1041, a third gate dielectric layer 1043, and a third gate conductor layer 1045 may be sequentially formed above the second transistor in the opening. A formation method of the third active layer 1041, the third gate dielectric layer 1043, and the third gate conductor layer 1045 may be referred to the above description for the first active layer 1027, the first gate dielectric layer 1029, and the first gate conductor layer 1031 in conjunction with FIG. 8, except that there is no need to etch the third active layer 1041 and a bottom portion of the third gate dielectric layer 1043, and a planarization process such as CMP may be performed after depositing the second gate conductor layer 1045, so that the third active layer 1041, the third gate dielectric layer 1043, and the third gate conductor layer 1045 may be left within the opening. Materials and thicknesses of the third active layer 1041, the third gate dielectric layer 1043, and the third gate conductor layer 1045 may be the same as or different from the materials and thicknesses of the first active layer 1027, the first gate dielectric layer 1029, and the first gate conductor layer 1031. In particular, the third active layer 1041 may include a semiconductor material with a relatively low leakage or a relatively large bandgap width (e.g., with respect to silicon) to increase data retention capability, while the first active layer 1027 may include a semiconductor material with a relatively high mobility (e.g., with respect to silicon) to reduce a read time (or increase a read speed).

As a result, the third transistor (e.g., a write transistor) is formed in each opening. As shown in FIG. 11(*a*), FIG. 11(*b*), and FIG. 11(*c*), each third transistor may include the third active layer 1041. The third active layer 1041 may extend along the sidewall of the opening and the top surface of the first transistor (and the isolation portion 1037), so as to have a cup shape. A portion in the third active layer 1041 that is connected to the fourth connection line layer 1021 may define an upper source/drain region of the third transistor. A portion in the third active layer 1041 that is connected to the second gate conductor layer 1035 may define a lower source/drain region of the third transistor. A portion between the upper and lower source/drain regions is a channel region controlled by the third gate conductor layer 1045 (via the third gate dielectric layer 1043). A channel length or a gate length of the third transistor is mainly defined by the thickness of the fourth isolation layer 1019.

Figure 12A:
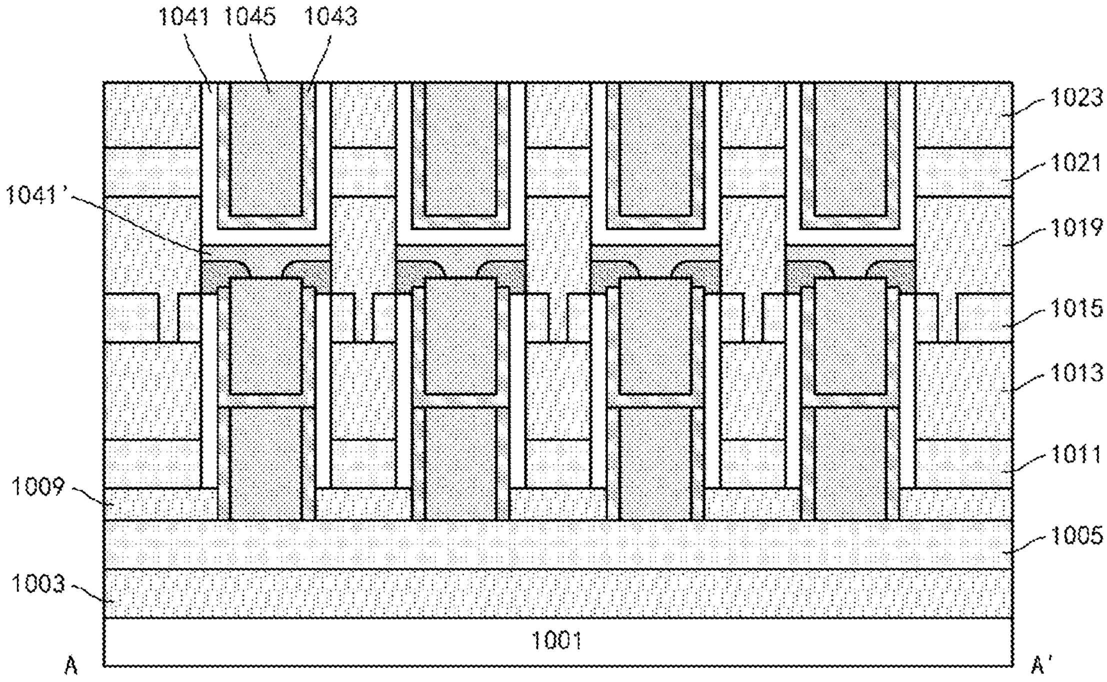
Figure 12B:
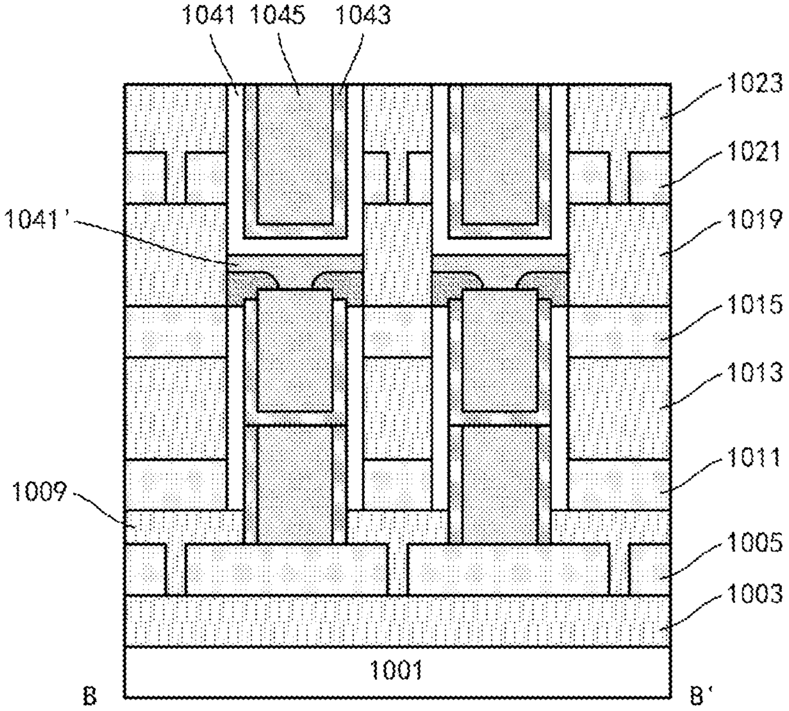

According to another embodiment of the present disclosure, as shown in FIG. 12(*a*) and FIG. 12(*b*), a connection portion 1041' may be formed in each opening before manufacturing the third transistor. For example, the connection portion 1041' may be formed by depositing a conductive material such as a metal, performing a planarization process such as CMP on the deposited conductive material, and etching back the planarized conductive material. A contact resistance with the second gate conductor layer 1035 may be reduced through the connection portion 1041'. In addition, a position of the bottom portion of the third gate conductor layer 1045 of the third transistor may be adjusted through the connection portion 1041', which may be conductive to controlling the gate length of the third transistor as described below. Hereinafter, a case shown in FIG. 12(*a*) and FIG. 12(*b*) is described as an example, but the description is also applicable to a case shown in FIG. 11(*a*), FIG. 11(*b*), and FIG. 11(*c*).

In addition, a fifth connection line layer may be formed on the fifth isolation layer 1023. For example, as shown in FIG. 13(*a*), FIG. 13(*b*), and FIG. 13(*c*), a sixth isolation layer 1047 may be formed, for example, by deposition. The sixth isolation layer 1047 may include a dielectric material such as an oxide, a nitride, a carbide, and the like to achieve electrical isolation. In the sixth isolation layer 1047, an opening corresponding to the third gate conductor layer 1045 of each third transistor and a groove extending in a fourth direction may be formed, for example, by a dual Damascus process. The opening and groove thus formed in the sixth isolation layer 1047 may be filled with a conductive material, for example, by deposition followed by planarization. A conductive material filled into the opening of the sixth isolation layer 1047 may form a contact plug 1049, while a conductive material filled into the groove of the sixth isolation layer 1047 may form a fifth conductive line 1051. The fifth conductive line 1051 may define WWL. In order to facilitate addressing of memory cells, the WWL defined by the fifth conductive line 1051 may intersect the WBL defined by the fourth conductive line in the fourth connection line layer 1021. That is, the fourth direction may intersect (e.g., perpendicular to) the third direction. In this example, in a case where the third direction is substantially the same as the first direction, the fourth direction may be substantially the same as the second direction.

In this way, the memory cell according to the embodiment is obtained.

Figure 17A:
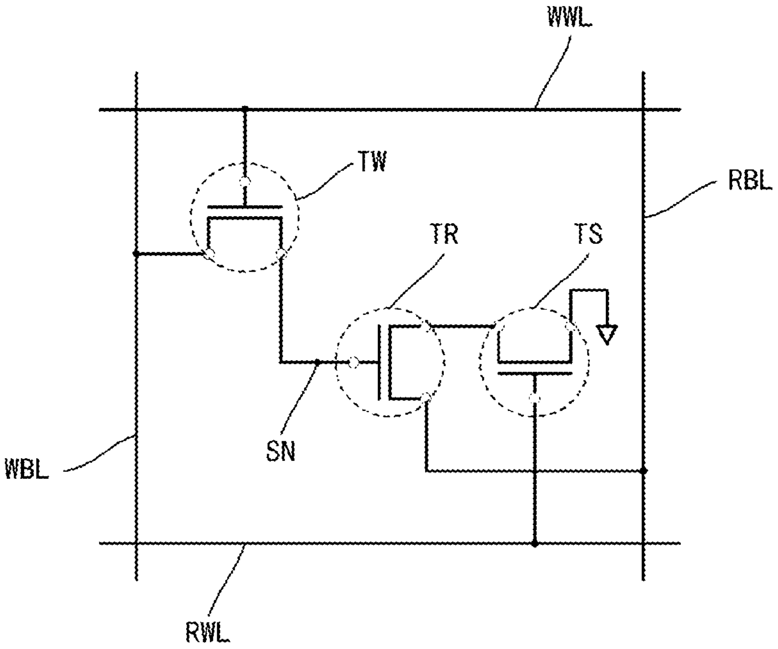
Figure 17B:
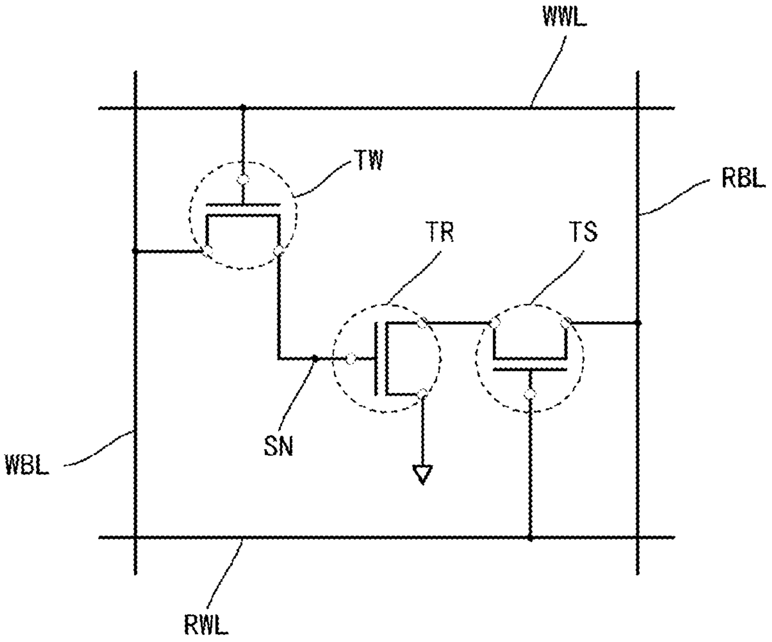

As shown in FIG. 17(*a*), the first transistor serving as a selection transistor TS may be connected between the second connection line layer 1011 (the ground plane) and the second transistor serving as a read transistor TR, and the gate electrode of the first transistor is electrically connected to the first conductive line (e.g., RWL) in the first connection line layer 1005. The second transistor may be connected between the first transistor and the third conductive line (e.g., RBL) in the third connection line layer 1015. The third transistor serving as a write transistor TW may be connected between the gate electrode of the second transistor and the fourth conductive line (e.g., WBL) in the fourth connection line layer 1021, and the gate electrode of third transistor is electrically connected to the fifth conductive line 1051 (e.g., WWL) in the fifth connection line layer.

In the memory cell, a memory element such as a capacitor may not be additionally provided, and a gate capacitance of the read transistor TR may be used as the memory element. A node between the write transistor and the read transistor is a memory node SN. Accordingly, the 3T0C configuration is obtained.

According to another embodiment, positions of the second connection line layer 1011 and the third connection line layer 1015 may be exchanged by, for example, changing their formation order. In this case, the first transistor serving as the selection transistor TS may be connected between the third conductive line (e.g., RBL) in the third connection line layer 1015 and the second transistor serving as the read transistor TR, and the second transistor may be connected between the first transistor and the second connection line layer 1011 (the ground plane). A configuration shown in FIG. 17(*b*) may be obtained.

In the above-mentioned embodiment, there may be a significant process fluctuation in the gate length of each transistor. According to embodiments of the present disclosure, the gate lengths of the transistors may be more accurately controlled.

Figure 14A:
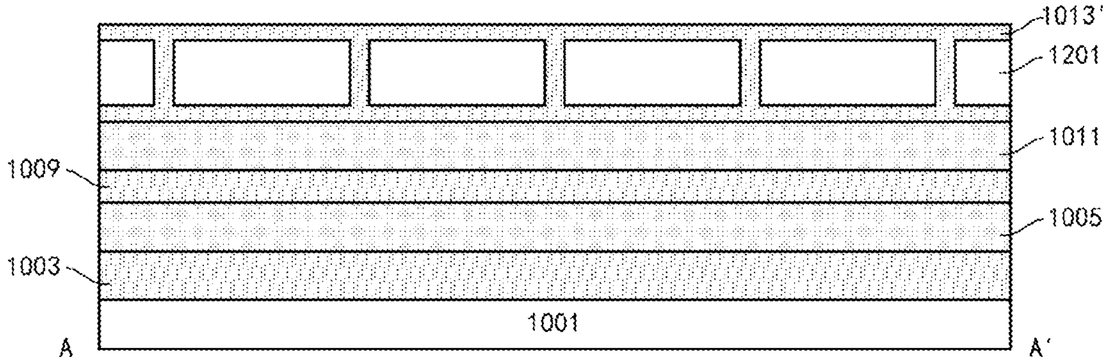
FIG. 14(*a*) to FIG. 16 show schematic diagrams of some stages in a process of manufacturing a memory device according to another embodiment of the present disclosure.
Figure 14B:
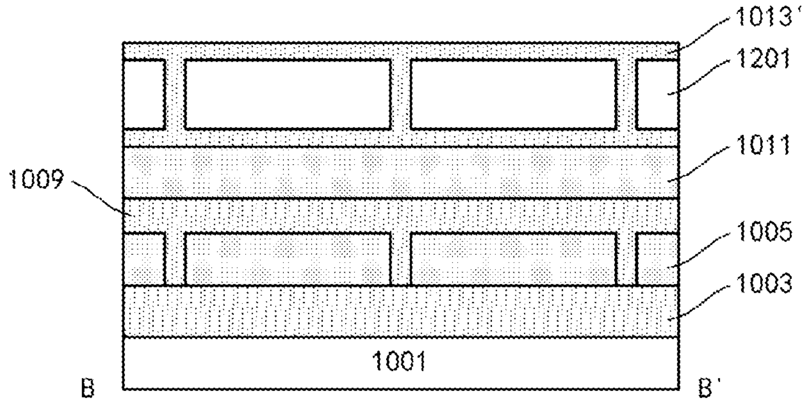
Figure 14C:
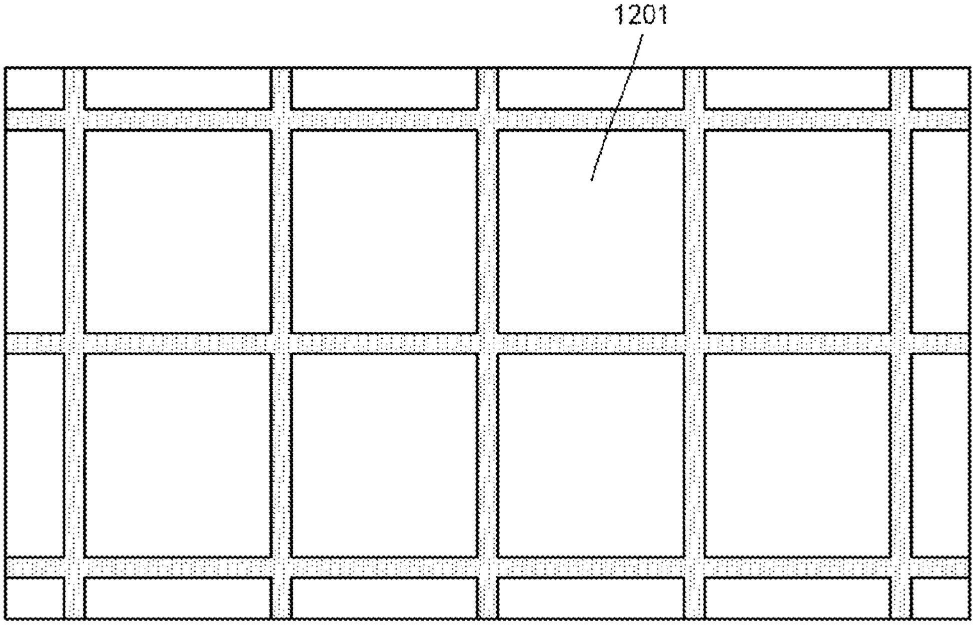
Figure 16:
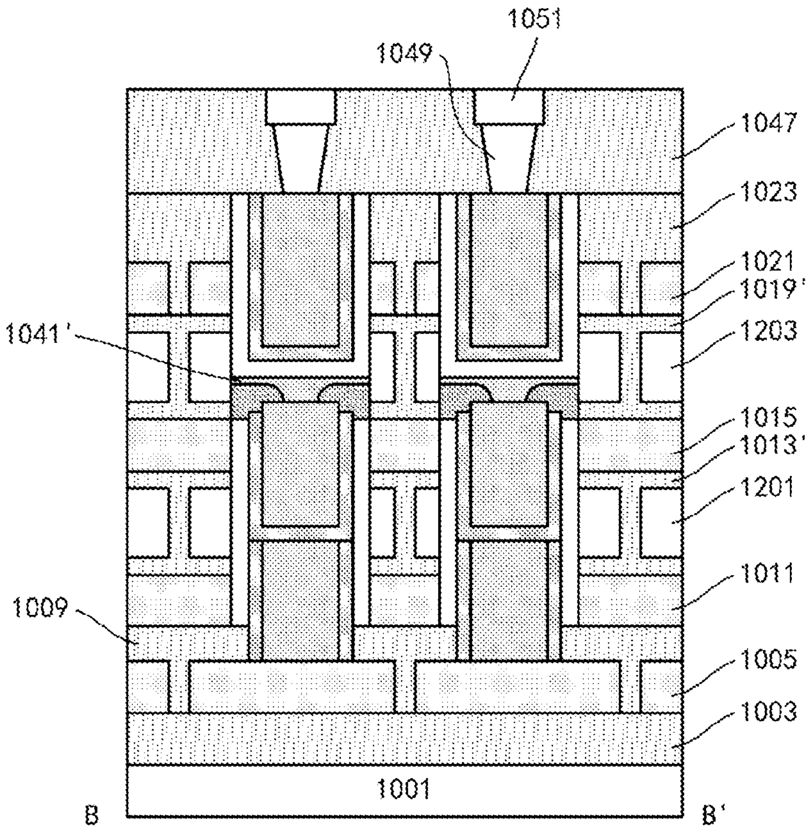

FIG. 14(*a*) to FIG. 16 show schematic diagrams of some stages in a process of manufacturing a memory device according to another embodiment of the present disclosure. Hereinafter, a difference between this embodiment and the above-mentioned embodiment will be mainly described.

As described above in conjunction with FIG. 1(*a*) to FIG. 3, a first isolation layer 1003, a first connection line layer 1005, a second isolation layer 1009, and a second connection line layer 1011 may be sequentially formed on a substrate 1001. Similarly, a third isolation layer 1013' may be formed on the second connection line layer 1011, with a difference that a gate length control layer 1201 may be inserted into the third isolation layer 1013', as shown in FIG. 14(*a*), FIG. 14(*b*) and FIG. 14(*c*). For example, a lower portion of the third isolation layer 1013' may be formed on the second connection line layer 1011 in the manner of forming the isolation layer described above. On the lower portion of the third isolation layer 1013', the gate length control layer 1201 may be formed, for example, by deposition. The gate length control layer 1201 may include a conductive material such as a metal, e.g., Mo, Ru, and the like, and have a thickness of, for example, about 10 nm to 150 nm. The gate length control layer 1201 may be patterned as a gate length control pad corresponding to each memory cell by selective etching such as RIE. For example, the gate length control layer 1201 may be patterned based on the above combined pattern (the pattern shown in FIG. 1(*a*)+the pattern shown in FIG. 4(*a*)) of a mask for patterning the first connection line layer and a mask for patterning the third connection line layer, so that the obtained gate length control pad may be located at an intersection of the first conductive line in the first connection line layer and the third conductive line in the third connection line layer, as shown in FIG. 14(*c*) (a sectional view of the gate length control layer 1201 on a plane parallel to the surface of the substrate). Then, an upper portion of the third isolation layer 1013' may be formed on the gate length control layer 1201 in the manner of forming the isolation layer described above.

Figure 15A:
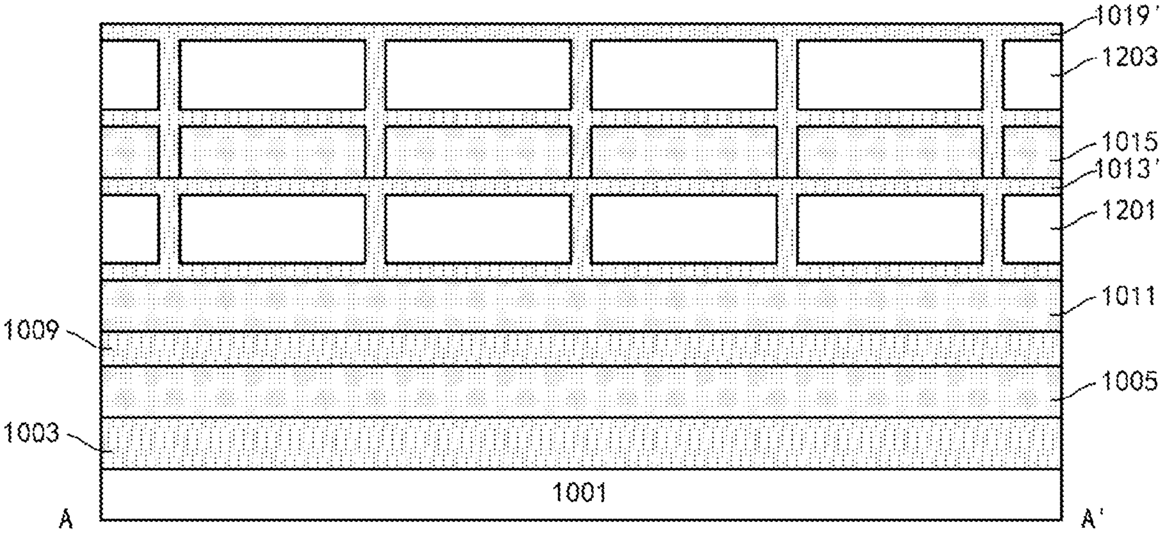
Figure 15B:
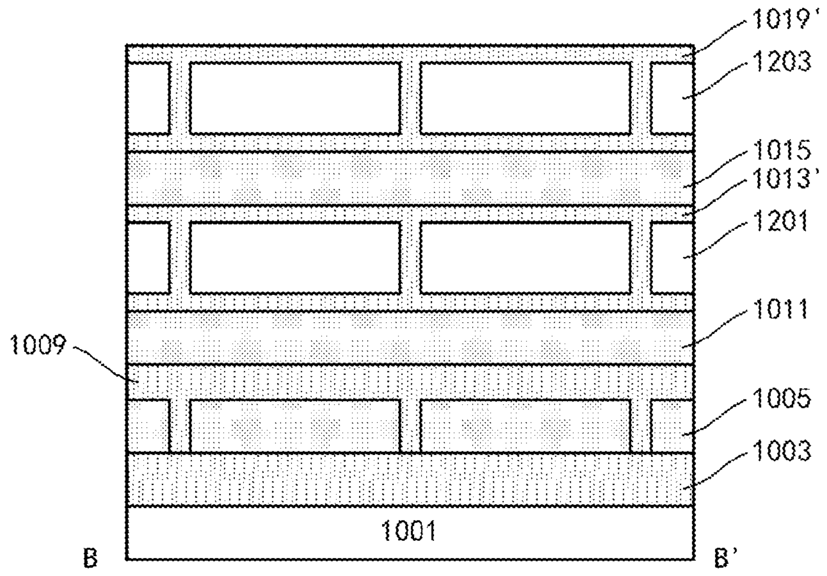

A third connection line layer 1015 may also be formed on the third isolation layer 1013' as described above in conjunction with FIG. 4(*a*) to FIG. 5, and a fourth isolation layer 1019' may be similarly formed on the third connection line layer 1015. A gate length control layer 1203 may be similarly inserted in the fourth isolation layer 1019', as shown in FIG. 15(*a*) and FIG. 15(*b*). For the formation of the fourth isolation layer 1019' and the gate length control layer 1203, please refer to the above description of the third isolation layer 1013' and the gate length control layer 1201.

Next, the process may be performed as in the above-mentioned embodiments. For example, as shown in FIG. 16, a space used for the active region of the transistor in the memory cell may be defined, that is, a series of openings arranged in an array may be formed. Similarly, such openings also respectively pass through corresponding gate length control pads in the gate length control layer 1201 and the gate length control layer 1203. Then, the first transistor to the third transistor that are stacked on each other may be formed in the openings.

Here, the connection portion 1041' is provided to better define the lower end of the channel region of the third transistor. More specifically, a top surface of the connection portion 1041' may be located between a top surface of the gate length control layer 1203 and a bottom surface of the gate length control layer 1203 (and thus the top surface of the connection portion 1041' is connected to the gate length control layer 1203), so that the lower portion of the third active layer 1041 is surrounded by a conductive material such as a metal (the connection portion 1041', the gate length control pad in the gate length control layer 1203), and thus is defined as a lower source/drain region. A top portion of the lower source/drain region is defined by the top surface of the gate length control layer 1203. On the other hand, a bottom portion of the upper source/drain region is defined by the bottom surface of the fourth connection line layer 1021. Accordingly, the length of the channel region (or the gate length) between the upper source/drain region and the lower source/drain region may be determined by a spacing between the top surface of the gate length control layer 1203 and the bottom surface of the fourth connection line layer 1021, i.e., a thickness (a thickness of the fourth isolation layer 1019' above the gate length control layer 1203) of the upper portion of the fourth isolation layer 1019'. Here, the bottom surface of the third gate conductor layer 1045 is located between the top surface of the gate length control layer 1203 and the bottom surface of the gate length control layer 1203, so as to cover an entire vertical range of the spacing or the thickness.

In this example, the top surface of the connection portion 1041' is shown to be substantially flat and located between the top surface of the gate length control layer 1203 and the bottom surface of the gate length control layer 1203. However, the present disclosure is not limited to this. The top surface of the connection portion 1041' may not be flat, but may have a shape such as being lower in the middle portion of the opening and higher near the sidewall of the opening, especially in a case of a thinner opening. Alternatively, the connection portion 1041' may be omitted. In such cases, the bottom portion of the third active layer 1041 may also extend unevenly on the lower structure, such as extend on the connection portion 1041' (which is lower in the middle portion and higher on both sides), or extend on the gate conductor layer 1031 and the isolation portion 1037 as in the above-mentioned embodiments in the case that the connection portion 1041' is omitted. At this point, the bottom surface of the gate conductor layer 1045 may not be flat, and a lowest part of the bottom surface of the gate conductor layer 1045 may be lower than the top surface of the gate length control pad in the gate length control layer 1203, so as to cover the entire vertical range of the spacing or the thickness.

Similarly, a highest part of the top surface of the first gate conductor layer 1031 may be higher than the bottom surface of the gate length control layer 1201 (the top surface of the first gate conductor layer 1031 may be located between the top surface of the gate length control layer 1201 and the bottom surface of the gate length control layer 1201 in a case of being substantially flat), and a lowest part of the bottom surface of the second gate conductor layer 1035 may be lower than the top surface of the gate length control layer 1201 (the bottom surface of the second gate conductor layer 1035 may be located between the top surface of the gate length control layer 1201 and the bottom surface of the gate length control layer 1201 in a case of being substantially flat). Therefore, the gate length of the first transistor may be determined by a spacing between the top surface of the second connection line layer 1011 and the bottom surface of the gate length control layer 1201, i.e., a thickness (a thickness of the third isolation layer 1013' below the gate length control layer 1201) of the lower portion of the third isolation layer 1013', while the gate length of the second transistor may be determined by a spacing between the top surface of the gate length control layer 1201 and the bottom surface of the third connection line layer 1015, i.e., a thickness (a thickness of the third isolation layer 1013' above the gate length control layer 1201) of the upper portion of the third isolation layer 1013'.

In this example, two gate length control layers 1201 and 1203 are provided. According to other embodiments, only one of them may be provided.

The memory device according to embodiments of the present disclosure may be applied to various electronic apparatuses. For example, the memory device may store various programs, applications, and data required for the operation of electronic apparatus. The electronic apparatus may further include a processor cooperating with the memory device. For example, the processor may operate the electronic apparatus by executing programs stored in the memory device. The electronic apparatus may include, for example, a smart phone, a personal computer (PC), a tablet computer, an artificial intelligence apparatus, a wearable apparatus, a mobile power supply, and so on.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

Embodiments of the present disclosure have been described above. However, the embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A memory device, comprising:

a first connection line layer, a second connection line layer, a third connection line layer, and a fourth connection line layer that are sequentially disposed in a vertical direction with respect to a substrate, wherein the first connection line layer comprises a plurality of first conductive lines extending parallel to each other in a first direction, one of the second connection line layer and the third connection line layer comprises a plurality of conductive lines extending parallel to each other in a second direction intersecting the first direction, and the fourth connection line layer comprises a plurality of fourth conductive lines extending parallel to each other in a third direction;

a plurality of memory cells, wherein each memory cell extends vertically from a corresponding first conductive line in the first connection line layer and respectively forms electrical connections with the second connection line layer or a corresponding conductive line in the second connection line layer, the third connection line layer or a corresponding conductive line in the third connection line layer, and a corresponding fourth conductive line in the fourth connection line layer, and each memory cell comprises a first transistor, a second transistor, and a third transistor that are stacked on each other in the vertical direction, wherein the first transistor comprises:

a first active layer, comprising a first source/drain region electrically connected with the second connection line layer or the corresponding conductive line in the second connection line layer, a second source/drain region, and a channel region between the first source/drain region of the first transistor and the second source/drain region of the first transistor in the vertical direction;

a first gate dielectric layer on the first active layer; and a first gate conductor layer on the first gate dielectric layer, wherein the first gate conductor layer extends towards the corresponding first conductive line in the first connection line layer to be electrically connected to the corresponding first conductive line in the first connection line layer, wherein the second transistor comprises:

a second active layer, comprising a first source/drain region, a second source/drain region electrically connected with the third connection line layer or the corresponding conductive line in the third connection line layer, and a channel region between the first source/drain region of the second transistor and the second source/drain region of the second transistor in the vertical direction, wherein the second source/drain region of the first transistor and the first source/drain region of the second transistor are close to each other and electrically connected with each other;

a second gate dielectric layer on the second active layer; and a second gate conductor layer on the second gate dielectric layer, wherein the second gate conductor layer and the first gate conductor layer are electrically isolated from each other, and wherein the third transistor comprises:

a third active layer, comprising a first source/drain region electrically connected with the second gate conductor layer, a second source/drain region electrically connected with the corresponding fourth conductive line in the fourth connection line layer, and a channel region between the first source/drain region of the third transistor and the second source/drain region of the third transistor in the vertical direction;

a third gate dielectric layer on the third active layer; and a third gate conductor layer on the third gate dielectric layer, and a fifth connection line layer above the memory cell, wherein the fifth connection line layer comprises a plurality of fifth conductive lines extending in a fourth direction intersecting the third direction, and the third gate conductor layer of each memory cell is electrically connected to a corresponding fifth conductive line in the fifth connection line layer, wherein the first active layer, the second active layer, and the third active layer are self-aligned in the vertical direction.

2. The memory device according to claim 1, wherein portions where the first active layer, the second active layer and the third active layer are adjacent to each other are substantially aligned in the vertical direction.

3. The memory device according to claim 2, wherein portions where an outer sidewall of the first active layer, an outer sidewall of the second active layer and an outer sidewall of the third active layer are adjacent to each other are substantially coplanar in the vertical direction.

4. The memory device according to claim 1, wherein each memory cell is surrounded by at least one of the second connection line layer or the corresponding conductive line in the second connection line layer, the third connection line layer or the corresponding conductive line in the third connection line layer, and the corresponding fourth conductive line in the fourth connection line layer.

5. The memory device according to claim 1, wherein the other of the second connection line layer and the third connection line layer is an integrated conductive plate.

6. The memory device according to claim 1, wherein the first active layer and the second active layer are provided by a same semiconductor layer.

7. The memory device according to claim 6, wherein the second source/drain region of the first transistor and the first source/drain region of the second transistor are regions in the semiconductor layer, which are located between a top surface of the first gate conductor layer and a bottom surface of the second gate conductor layer in the vertical direction.

8. The memory device according to claim 6, wherein the semiconductor layer is in a shape of a vertically extending ring, and an outer sidewall of the ring-shaped semiconductor layer is in physical contact with the second connection line layer or the corresponding conductive line in the second connection line layer at a lower portion and in physical contact with the third connection line layer or the corresponding conductive line in the third connection line layer at an upper portion.

9. The memory device according to claim 8, wherein the first gate dielectric layer extends along an inner sidewall of the ring-shaped semiconductor layer, an inner space of the first gate dielectric layer is filled with the first gate conductor layer, and the first gate conductor layer extends towards the corresponding first conductive line in the first connection line layer and is in physical contact with the corresponding first conductive line in the first connection line layer.

10. The memory device according to claim 8, wherein the second gate dielectric layer has a vertical extending portion extending along an inner sidewall of the ring-shaped semiconductor layer and a bottom portion, an inner space of the second gate dielectric layer is filled with the second gate conductor layer, and the first gate conductor layer and the second gate conductor layer are electrically isolated from each other through the bottom portion of the second gate dielectric layer.

11. The memory device according to claim 8, wherein the third active layer has a bottom portion and a vertical extending portion extending vertically upward from the bottom portion of the third active layer, wherein the bottom portion of the third active layer is electrically connected with the second gate conductor layer, and the vertical extending portion of the third active layer is in physical contact with the corresponding fourth conductive line in the fourth connection line layer.

12. The memory device according to claim 11, wherein the bottom portion of the third active layer is in physical contact with the second gate conductor layer.

13. The memory device according to claim 11, wherein the memory cell further comprises:

a connection portion between the second transistor and the third transistor, wherein the bottom portion of the third active layer is electrically connected with the second gate conductor layer through the connection portion.

14. The memory device according to claim 11, wherein the third gate dielectric layer extends along an inner wall of the third active layer, and an inner space of the third gate dielectric layer is filled with the third gate conductor layer.

15. The memory device according to claim 11, wherein the ring-shaped semiconductor layer is substantially aligned with the vertical extending portion of the third active layer in the vertical direction.

16. The memory device according to claim 11, further comprising:

a first gate length control layer between the second connection line layer and the third connection line layer, wherein the first gate length control layer comprises a first gate length control pad disposed around the memory cell, a highest part of a top surface of the first gate conductor layer is higher than a bottom surface of the first gate length control pad, and a lowest part of a bottom surface of the second gate conductor layer is lower than a top surface of the first gate length control pad; and/or a second gate length control layer between the third connection line layer and the fourth connection line layer, wherein the second gate length control layer comprises a second gate length control pad disposed around the memory cell, and a lowest part of a bottom surface of the third gate conductor layer is lower than a top surface of the second gate length control pad.

17. The memory device according to claim 11, wherein the memory cell further comprises:

an isolation portion in a form of spacer between the semiconductor layer and the third active layer.

18. The memory device according to claim 17, wherein the ring-shaped semiconductor layer, the vertical extending portion of the third active layer and an outer sidewall of the isolation portion are substantially coplanar in the vertical direction.

19. The memory device according to claim 1, wherein at least one of the first active layer, the second active layer, and the third active layer comprises indium gallium zinc oxide.

20. The memory device according to claim 1, wherein the second active layer comprises a semiconductor material with a relatively high mobility, and the third active layer comprises a semiconductor material with a relatively low leakage or a relatively large bandgap width.

21. The memory device according to claim 1, wherein the memory cell further comprises:

an isolation portion in a form of spacer between the second active layer and the third active layer, wherein the first active layer, the second active layer, the third active layer, and the isolation portion are self-aligned in the vertical direction.

22. The memory device according to claim 1, wherein the memory device is a dynamic random access memory, the first conductive line corresponds to a read word line, the corresponding conductive line of one of the second connection line layer and the third connection line layer corresponds to a read bit line, the corresponding conductive line of the other of the second connection line layer and the third connection line layer corresponds to a ground plane, the fourth conductive line corresponds to a write bit line, and the fifth conductive line corresponds to a write word line.

23. An electronic apparatus, comprising the memory device according to claim 1.

24. The electronic apparatus according to claim 23, wherein the electronic apparatus comprises a smart phone, a personal computer, a tablet computer, an artificial intelligence device, a wearable device or a mobile power supply.

* * * * *